(12) United States Patent
Lim

(10) Patent No.: US 11,996,521 B2
(45) Date of Patent: *May 28, 2024

(54) ELECTROCHEMICAL DEVICE COMPRISING CARBON QUANTUM DOT IONIC COMPOUND ELECTROLYTE

(71) Applicant: GRAPHENIDE TECHNOLOGY CO., LTD., Gunpo-si (KR)

(72) Inventor: Hong Chul Lim, Suwon-si (KR)

(73) Assignee: GRAPHENIDE TECHNOLOGY CO., LTD., Gunpo-si (KR)

( * ) Notice: Subject to any disclaimer, the term of this patent is extended or adjusted under 35 U.S.C. 154(b) by 393 days.

This patent is subject to a terminal disclaimer.

(21) Appl. No.: 16/616,304

(22) PCT Filed: May 24, 2018

(86) PCT No.: PCT/KR2018/005923
§ 371 (c)(1),
(2) Date: Nov. 22, 2019

(87) PCT Pub. No.: WO2018/217044
PCT Pub. Date: Nov. 29, 2018

(65) Prior Publication Data
US 2020/0144671 A1 May 7, 2020

(30) Foreign Application Priority Data

May 24, 2017 (KR) .................. 10-2017-0064231
May 23, 2018 (KR) .................. 10-2018-0058236

(51) Int. Cl.
*H01M 10/0568* (2010.01)
*H01M 10/0525* (2010.01)

(52) U.S. Cl.
CPC ... *H01M 10/0568* (2013.01); *H01M 10/0525* (2013.01); *H01M 2300/0025* (2013.01)

(58) Field of Classification Search
CPC ......... H01M 10/0568; H01M 10/0525; H01M 2300/0025
See application file for complete search history.

(56) References Cited

U.S. PATENT DOCUMENTS

| | | | |
|---|---|---|---|
| 5,569,560 A | 10/1996 | Olsen et al. | |
| 2012/0116094 A1* | 5/2012 | Swager | C07F 5/00 562/466 |
| 2018/0301714 A1* | 10/2018 | Yang | H01M 4/139 |

FOREIGN PATENT DOCUMENTS

| | | |
|---|---|---|
| CN | 106129469 A | 11/2016 |
| KR | 10-2006-0045803 A | 5/2006 |

(Continued)

OTHER PUBLICATIONS

Zhang et al., Graphene quantum dots as the electrolyte for solid state supercapacitors, Scientific Reports, Jan. 14, 2016, vol. 6, No. 1.

(Continued)

*Primary Examiner* — Osei K Amponsah
(74) *Attorney, Agent, or Firm* — Venable LLP

(57) ABSTRACT

The present invention relates to an electrochemical device, more particularly to an electrochemical device including a first electrode, a second electrode spaced apart from the first electrode and an electrolyte filled between the first electrode and the second electrode, wherein the electrolyte comprises a salt form of a carbon quantum dot anion and a metal cation having an average diameter in the range of 2 to 12 nanometers (nm) and a surface potential of −20 mV or less, the present invention provides an electrochemical device dramatically improving reliability, performance and durability by adopting an carbon quantum dot ion compound electrolyte having selective ion conductivity with a specific cation and suppressing side reactions caused by electrolyte as well as applicable in liquid, gel or solid phase.

5 Claims, 20 Drawing Sheets

(56) References Cited

FOREIGN PATENT DOCUMENTS

| | | | |
|---|---|---|---|
| KR | 10-2007-0071731 A | 7/2007 | |
| KR | 10-2012-0035834 A | 4/2012 | |
| KR | 10-2014-0003783 A | 1/2014 | |
| KR | 10-2015-0004124 A | 1/2015 | |
| KR | 10-1534313 B1 | 7/2015 | |
| KR | 10-2017-0064227 A | 6/2017 | |
| WO | 2010-083041 A1 | 7/2010 | |
| WO | 2017-077381 A2 | 5/2017 | |

OTHER PUBLICATIONS

Bak et al., "Graphene quantum dots and their possible energy applications: A review", Current Applied Physics, Elsevier, Amsterdam, NL, May 3, 2016, pp. 1192-1201, vol. 16, No. 9.

Hwang et al., "An Electrolyte-Free Flexible Electrochromic Device Using Electrostatically Strong Graphene Quantum Dot-Viologen Nanocomposites", Advanced Materials, Jun. 2, 2014, pp. 5129-5136, vol. 26, No. 30.

"A Basic Guide to Particle Characterization", Malvern Instruments Worldwide—White Paper, May 2, 2012, pp. 1-26.

G. Leftheriotis et al., The effect of water on the electrochromic properties of WO3 films prepared by vacuum and chemical methods, Research, Feb. 23, 2004, pp. 115-124, vol. 83.

Nugent, J.L. et al., Nanoscale Organic Hybrid Electrolytes, Journal, Jul. 21, 2010, pp. 3677-3680.

Schaefer, J.L. et al., Nanoporous hybrid electrolytes, Journal, Jan. 10, 2011, pp. 10094-10101, vol. 21.

Nugent, JL et al., Ionic liquid-nanoparticle hybrid electrolytes, Journal, Jan. 4, 2012, pp. 4066-4071, vol. 22.

Hong Chul Lim et al., "New Highly Stable Ionic Compounds Composed of Multivalent Graphene Quantum Dot Anions and Alkali Metal Cations", Batteries & Supercaps, 2021, pp. 1-8.

Office Action dated Jun. 21, 2023 in U.S. Appl. No. 16/616,283.

N.J. Dudney, "Addition of a thin-film inorganic solid electrolyte (Lipon) as a protective film in lithium batteries with a liquid electrolyte", Journal of Power Sources, vol. 89, pp. 176-179 (2000).

* cited by examiner lithium ion secondary battery comprising carbon quantum dot anion - metal cation electrolyte

ELECTROCHEMICAL DEVICE COMPRISING CARBON QUANTUM DOT IONIC COMPOUND ELECTROLYTE

FIELD OF THE INVENTION

The present invention relates to an electrochemical device, more particularly to an electrochemical device including a first electrode, a second electrode spaced apart from the first electrode and an electrolyte filled between the first electrode and the second electrode, wherein the electrolyte comprises a salt form of a carbon quantum dot anion and a metal cation having an average diameter in the range of 2 to 12 nanometers (nm) and a surface potential of −20 mV or less.

BACKGROUND ART

In recent year, as the use of renewable energy increases rapidly, the necessity of improving the efficiency and reliability of electrochemical devices such as secondary batteries, electrochromic devices and dye-sensitized solar cells is increasing.

On the other hand, an electrolyte is an essential component for the operation of the electrochemical device through the flow of ions and ion exchange in solution, thereby forms resistive contact between the electrode and the solution. The electrolyte does not participate in the oxidation/reduction reaction directly, but supports the electrochemical reaction. The electrolyte is generally in the form of a salt, which is usually used in a liquid by dissolving it in a solvent or gel form, but in some cases, it can be also dispersed in a solid. Recently, there is a great interest in polymer electrolytes having processability, mechanical strength and operating temperature suitable for electrochromic devices. The conventional electrochromic device has a problem in terms of stability because the electrode material constituting the internal electrode and elecrochromic material react with the electrolyte and break the reversibility of insertion and desorption of ions (H+, Li+, etc.). In the case of liquid electrolytes, which are mainly used, organic solvents are used in many cases. Organic solvents have stability problems such as ignition, evaporation, and leakage. On the other hand, solid state electrolytes are more stable than liquid electrolytes, but exhibit low ionic conductivity and have problems such as increased interfacial contact resistance and deterioration of devices.

Complex phenomena occur in electrolytes containing conductive salts. For example, when the salt concentration increases, the ion conductivity decreases from the decrease in the diffusion coefficient of the ions due to the increase in the viscosity. In addition, it is difficult to secure the stability of the device due to side reactions with the electrode or other materials. In particular, there is a problem of lowering the reliability of the electrochemical device due to the low diffusion coefficient and the transport rate of the metal cation. When the diffusion coefficient of lithium ions is lower than that of the other cation constituting the electrolyte, it is difficult for lithium ions to approach the surface of the electrode and lithium ions cannot be inserted into the electrode. Therefore, the electrochemical reaction does not occur. $LiPF_6$ is mainly used as an electrolyte in lithium ion batteries because $LiPF_6$ has excellent overall physical properties such as ion mobility, ion pair dissociation, solubility, and SEI formation than the other electrolytes. However, LiPF6 has problems such as poor thermal stability and side reactions even with a small amount of water. Moreover, when the temperature rises, the following side reactions accelerate the continuous decomposition of the electrolyte and induce the gas to inflate the battery and lead to explosion.

$$LiPF_6(s) \leftrightharpoons LiF(s) + PF_5(g) \quad (1)$$

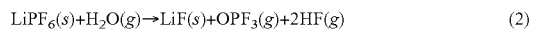

$$LiPF_6(s) + H_2O(g) \rightarrow LiF(s) + OPF_3(g) + 2HF(g) \quad (2)$$

Electrochromic device (ECD) refers to a device that changes the light transmittance characteristics by changing the color of the electrochromic material due to the redox reaction in response to the application of an electric field. The most successful products are a rear view mirror of the car that automatically adjusts the glare of the light at the rear at night, and a smart window, a window that can be automatically adjusted according to the light intensity. The smart window changes to a darker color tone to reduce the amount of light in sunny day, whereas it changes to a lighter color tone on a cloudy day, which makes the energy saving efficiency excellent. In addition, the application of the ECD in display, such as an electronic board (e-book), etc. is continuously developing. The constitution of ECD is similar to that of a battery system. ECD have an electrochromic layer (anode)/electrolyte (Li+, H+)/relative electrode layer (cathode). Briefly explaining the principle of the electrochromic, it is colored when the cation such as Li+ or H+ and electrons are injected into the electrochromic layer (WxOy, MoxOy, etc.), which is a reducing coloring material, and becomes transparent when released from it. On the contrary, the positive electrode layer (VxOy, NixOy, etc.), which is an oxide coloring material, is colored when the cations such as Li+ and H+ and electrons are released from it, and becomes transparent when injected into that.

The electrochromic layer constituting the ECD is divided into a reducing coloring material and an oxidizing coloring material. The reducing coloring material, for example tungsten oxide, is a material that is colored when obtaining electrons. On the contrary, the oxidative coloring material is a material that is colored when the electrons are lost, and representative examples thereof include nickel oxide and cobalt oxide. In addition, representative electrochromic materials include inorganic metal oxides such as V2O5, Ir(OH)x, NiOxHy, TiO2, and MoO3, conductive polymers such as PEDOT (poly-3,4-ethylenedioxythiophene), polypyrrole, polyaniline, polyazulene, polythiophene, polypyridine, polyindole, polycarbazole, polyazine and polyquinone, and organic coloring materials such as viologen, anthraquinone and phenocyazine. In order to improve the safety and coloration efficiency of the ECD, a method of direct coating of coloring material to a working electrode has been developed. In this case, the ion storage medium must be formed on the counter electrode and the electrolyte must be included between the two electrodes to complete the electric circuit of the ECD. Therefore, in order to realize a high efficiency, high stability of the ECD, it is necessary to improve the electrochemical properties of the electrolyte, the color change material, and the ion storage medium as well as the structure of the ECD. In the case of the ECD and the electroluminescent device, chelate complexes formation of the anion of the electrolyte with the color change material or the light emitting material reduce the reliability of the electrochemical device. In order to remedy these shortcomings, large complex anion structures and organic ligand anion structures are attracting attention. In addition, tungsten oxide, which has been studied extensively as an electrochromic material, causes irreversible chemical reaction with lithium ions embedded in an ECD, so that lithium ions are trapped in each layer of the ECD, and thus, each layer of the ECD is decomposed, splits into thin layers, and deteriorates the characteristics of the electrochromic device, and it can be deformed into a material that can no longer electrochromate or cause an electric leakage of the device, thereby losing its function as an electrochromic device. (NJ Dudney, J. Power Sources, 89 (2000) 17; G. Leftheriotis, S. Papaefthimiou, P. Yianoulis, Solar Energy Materials and Solar Cells, 83 (2004) 115).

Therefore, several suggestions have been proposed to solve these problems. Recently, solvent-free hybrid electrolytes based on nanoscale organic/silica hybrid materials (NOHM) with lithium salts have been reported [Nugent, J. L. et al, Adv. Mater., 2010, 22, 3677; Lu, Y. et al, J. Mater. Chem., 2012, 22, 4066]. This electrolyte has a uniformly dispersed nanoparticle core, to which the polyethylene glycol (PEG) chain is covalently bonded. This electrolyte is self-suspended to provide a homogeneous fluid, wherein the PEG oligomers simultaneously act as a suspension medium for the nanoparticle core and as an ion-conducting network for lithium ion transport. WO2010/083041 also discloses a NOHM based hybrid electrolyte comprising a polymer corona doped with a lithium salt, a polymer corona attached to an inorganic nanoparticle core. Chaefer, J. L. et al. (J. Mater. Chem., 2011, 21, 10094) also disclosed $SiO_2$ nanoparticle hybrid electrolyte covalently binding to dense brushes of oligo-PEG chains doped with lithium salts, in particular lithium bis (trifluoromethanesulfonimide). This electrolyte is made from polyethylene glycol dimethylether (PEGDME) and provides good ion conductivity. However, the negative ions of lithium salts move freely through the electrolyte, and two-thirds of the current is carried by the negative ions, resulting in high polarization, thus causing internal resistance and voltage losses. In Korean Patent Publication No. 10-2015-0004124, Nanoparticulate organic hybrid materials are disclosed, characterized in that having a nanoparticulate organic containing inorganic nanoparticles covalently grafted with one or more anions of organic sodium salt or organic lithium salt through a linker group as bellows;

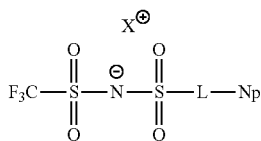

(I)

Wherein Np represents an inorganic nanoparticle; L is a linker group selected from a C1-C6 alkylene group and a phenyl-C1-C4-alkylene group; and

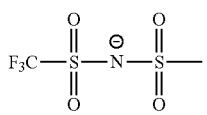

is anion of an organic sodium salts or organic lithium salt and; X+ is sodium or lithium cation. Also, Korean Patent Laid-Open Publication No. 10-2011-0003505 disclosed an electrolyte comprising a solvent having chemical structure like bellows;

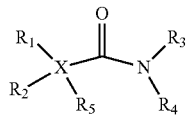

(wherein X is C, N, O or aryl having substituent on aryl ring, provided that $R_2$ does not exist when X is a nitrogen, both $R_1$ and $R_2$ does not exist when X is an oxygen, and when R is an aryl group, none of $R_1$, R 2 and R 5 are present; R 1 is a hydrogen atom or a carbon-based group; R 2 is a hydrogen atom or a carbon-based group; R 3 is a hydrogen atom or a carbon-based group; R4 and R5 are individually selected from hydrogen atoms or carbon-based groups, or R4 and R5 together form a carbon-based group to give a ring structure.); and a mixture comprising ionizable materials forming a solution with the solvent, characterized by solvating a polymer in the mixture.

However, the electrolytes for the conventional ECD including the above-mentioned document are deteriorated due to its weak durability, the anion and/or cation of the electrolyte constituting the ionic salt react with the material constituting the electrochemical device (electrode, material participating in the oxidation/reduction reaction) reduces the durability of the electrochemical device.

The commercialized lithium ion battery is known to be difficult to be used as a large-scale power storage device due to the scarcity of lithium resources and the resulting cost increase. In addition, the formation of dendrites of lithium metal in batteries has a problem of stability causing internal overheating and/or combustion. In order to solve this problem, studies are being conducted to use metal cations such as sodium (Na+), potassium (K+), and magnesium (Mg 2+). However, due to the difficulty in finding the electrode material suitable for such metal cations, low ion conductivity and low energy density, another metal ion battery has not been commercialized yet. Therefore, a new type of electrolyte for high performance electrochemical devices is required, with no risk of explosion and ignition. Also, the properties for the new electrolyte is required to be inflammable, non-volatile, non-toxic, etc. for safety in use and after disposal. Several classes of electrolytes with inorganic or organic properties have been studied as replacements for conventional liquid electrolytes. Typical materials used in the preparation of polymers, polymer composites, hybrids, gels, ionic liquids, ceramics or solid electrolytes are inorganic matrices derived from nanoparticle oxides such as β-alumina and such as Nasicon and silicon dioxide. It may be a simple lithium halide with improved grain boundaries defects or sulfide glass in a $SiS_2+Li_2S+LiI$ system. However, due to the low ion conductivity (~$10^{-4}$ S/cm) and low energy density of gels and solid electrolytes, they are not widely commercially available. For example, magnesium (Mg) secondary batteries, one of the next generation ion battery candidate, is paid attention due to high energy density/high output and not-forming dendritic growth on the electrode surface during the charging/discharging process. However, magnesium cathode is incompatible with conventional inorganic ionic salts. Moreover, owing to brittleness of magnesium, unavoidable volume changes in operation, which may causes stress and cracking in the electrolyte.

In order to overcome the volume change in operation, it is preferable to use an organic polymer matrix in electrolyte. Typical polymer examples may include polyethylene oxide, polypropylene oxide or polyethyleneimine and copolymers thereof. These materials are used in combination with suitable lithium salts such as lithium bis (trifluoromethanesulfonyl imide [Li (CF$_3$S0$_2$) 2N](LiTFSI), and lithium tetrafluoroborate (LiBF$_4$). The main disadvantage of the electrolyte is its ambipolar conductivity: When current is applied, both the anion and the cation are mobile such that about one third of the current through the electrolyte is carried by the cation and two thirds by the anion. Transport number t+ is defined as bellows;

$$t+=\sigma cation/\sigma cation+\sigma anion=D\ cation/D\ cation+D\ anion,$$

wherein σ and D are defined as conductivity and diffusion coefficient of each charged species, respectively. In most battery electrode systems, only cations react at the electrode, so that electric neutrality accumulates salts around the anode, whereas salts near the cathode are depleted. Since inhomogeneity of electrolytes induces very low conductivity, the polarization of the cell increases significantly with decreasing power capacity. For example, U.S. Pat. No. 5,569,560 disclosed the use of an anionic complexing agent comprising a polyamine with a strong electron-removing unit CF$_3$S0$_2$ attached in order to slow the anion, whereby lithium cations are used on a larger scale in electrochemical cells. However, the effect on the transport rate t+ is negligible. In recent year, solvent-free hybrid electrolytes based on nanoscale organic/silica hybrid materials (NOHM) with lithium salts have been developed (Nugent, J L et al, Adv. Mater., 2010, 22, 3677; Lu, Y. et al, J. Mater. Chem., 2012, 22, 4066). This electrolyte has a nanoparticle core bonded to polyethylene glycol (PEG) chain. This electrolyte is self-suspended to provide a homogeneous fluid, wherein the PEG oligomers act as a suspension medium for the nanoparticle core and as an ion-conducting network for lithium ion transport simultaneously. WO2010/083041 also discloses a NOHM based hybrid electrolyte comprising a polymer corona doped with a lithium salt, a polymer corona attached to an inorganic nanoparticle core. Chaefer, J. L. et al. (J. Mater. Chem., 2011, 21, 10094) also disclosed SiO2 nanoparticle hybrid electrolyte covalently binding to dense brushes of oligo-PEG chains doped with lithium salts, in particular lithium bis (trifluoromethanesulfonimide). This electrolyte is made from polyethylene glycol dimethylether (PEGDME) and provides good ion conductivity. However, the negative ions of lithium salts move freely through the electrolyte, and two-thirds of the current is carried by the negative ions, resulting in high polarization, thus causing internal resistance and voltage losses.

DISCLOSURE OF INVENTION

Therefore, the object of the present invention is to provide an electrochemical device improving efficiency, performance and durability by preventing decomposition or deformation of the electrode material or ionic salt, and side reactions of the material constituting the electrode in which the reversible electrochemical redox reaction occurs.

In order to achieve the above object, the present invention provides an electrochemical device including a first electrode, a second electrode spaced apart from the first electrode and an electrolyte filled between the first electrode and the second electrode, wherein a reversible electrochemical redox reaction occurs at no less than one electrode of the both electrode and the electrolyte comprises a salt form of a carbon quantum dot anion and a metal cation having an average diameter in the range of 2 to 12 nanometers (nm) and a surface potential of −20 mV or less.

The present invention also provides an electrochemical device, characterized in that the metal is at least one selected from the group consisting of Li, Na, K, Mg and Zn.

The present invention also provides an electrochemical device, characterized in that the electrochemical device is one selected from the group consisting of a secondary battery, a solar cell, an electrochromic device and an electroluminescent device.

In addition, the present invention provides an electrochemical device, characterized in that the secondary battery is a lithium ion battery or a lithium polymer battery.

Effects of the Invention

The present invention provides an electrochemical device adapting carbon quantum dot ionic compound as an electrolyte, which improves the ion conductivity due to very small dissociation energy of the anion and the cation, and enables charge transference by sole cation due to the relatively slow movement speed of the anion compared to the metal cation, and thereby dramatically increasing the reliability, efficiency and durability of the device. Due to the large polarization and high thermochemical/electrochemical stability of the electrolyte, less side reactions occur during device driving, thereby improving selective ion conductivity with specific cations in the device and improving device reliability and performance of the device. And the electrolyte can be utilized in liquid, gel or solid phase.

BEST MODE FOR CARRYING OUT THE INVENTION

Hereinafter, the present invention will be described in detail referring the accompanying drawings as below.

In the present specification, the term 'electrochemical device' refers to a device comprising a first electrode, a second electrode spaced apart from the first electrode and forming an electrically opposite to the first electrode, and electrolyte filled between the first electrode and the second electrode, wherein an electrochemical reaction is performed and a reversible electrochemical redox reaction occurs at the one or both of the first electrode and the second electrode. And the term 'carbon quantum dot' refers to a quantum dot in the form of graphite oxide having at least one oxygen functional group capable of becoming anions on the surface and/or the edge thereof and having an average diameter in the range of 2 to 12 nm and the surface potential of −20 mV or less; or quantum dots derivatives produced by reacting the quantum dot with polymerizable group. And the term 'carbon quantum dot anion' refers to carbon quantum dot of the oxygen functional group anionized.

The electrochemical device according to the present invention comprises a first electrode; a second electrode spaced apart from the first electrode and forming an electrically opposite to the first electrode; and electrolyte filled between the first electrode and the second electrode, wherein an electrochemical reaction is performed and a reversible electrochemical redox reaction occurs at the one or both of the first electrode and the second electrode and the electrolyte comprises ion salt of carbon quantum dot anion having an average diameter in the range of 0.1 to 8 nm and the surface potential of −20 mV or less and a metal cation.

In the present invention. The first electrode may be a working electrode or an anode, and the second electrode forming an electrically opposite of the first electrode may be a counter electrode or a cathode. Reversible electrochemical redox reaction occurs at one or both of the first electrode and the second electrode.

Figure 2A:
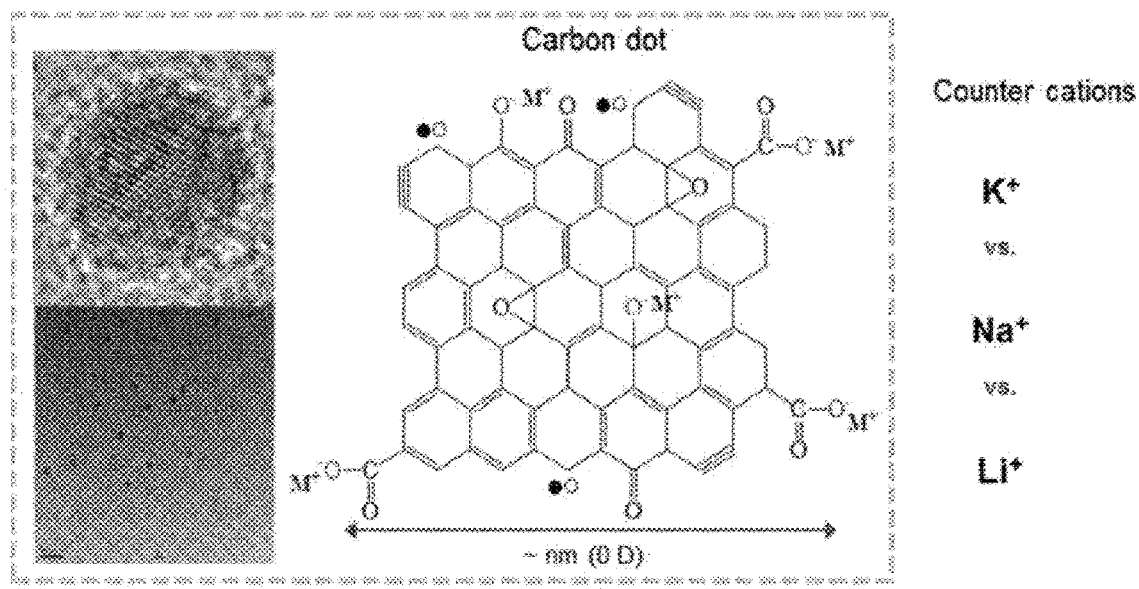
FIG. 2 (a) is the electron microscope image and a schematic diagram of the structure of the carbon quantum dot ionic compound, (b) is a graph showing the absorption and emission profiles of the carbon quantum dot ionic compound of an electrolyte for an electrochemical device according to the present invention.
Figure 2B:
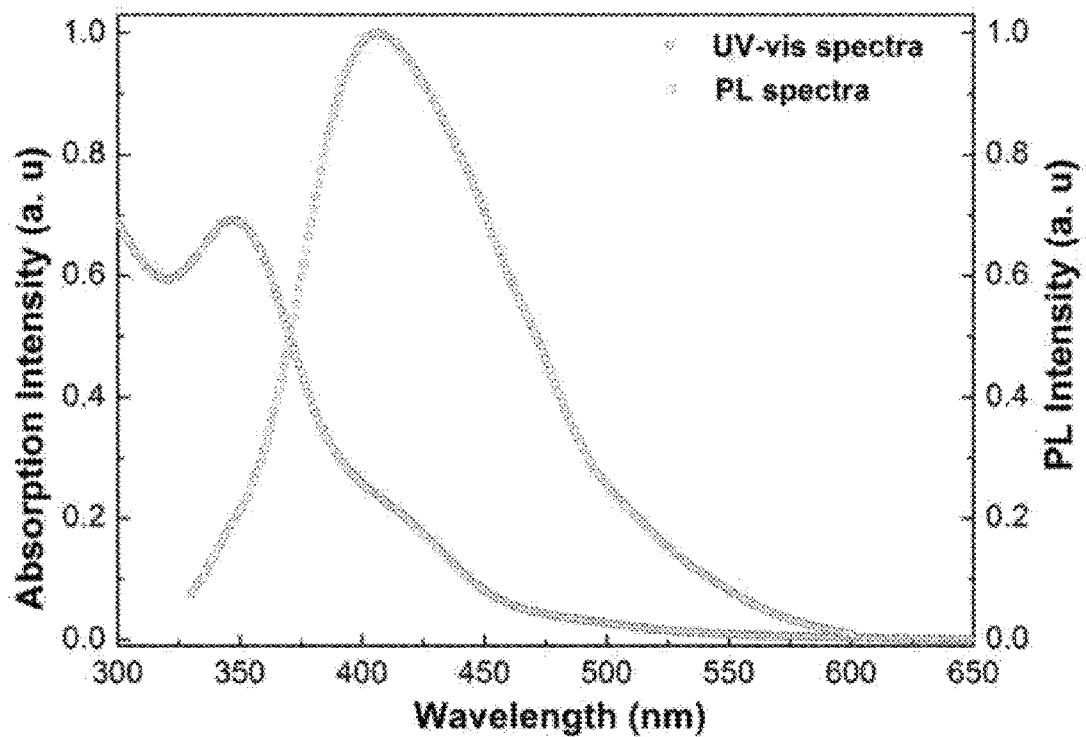

The carbon quantum dot anion in the present invention has a form of a polyanionic ($A^{n-}$), aromatic ring structure inside and oxygen functional groups on the surface and edge. The carbon quantum dot anion is combined with a metal cation to form a salt type ionic compound. FIG. 2 (a) is the electron microscope image and a schematic diagram of the structure of the carbon quantum dot ionic compound, (b) is a graph showing the absorption and emission profiles of the carbon quantum dot ionic compound of an electrolyte of an electrochemical device according to the present invention. The carbon quantum dot ionic compound as shown in FIG. 2 is expected as follows; 1) Due to the negative surface charges, ionic bonds with various metal cations such as alkali metals, alkaline earth metals, and transition metals are possible. 2) Large size and multiple negative surface charges, which have a large polarity and low lattice energy. 3) Delocalization of the electron cloud is large due to resonance of the internal structure. In addition, 4) it is a macromolecular anion, so there is almost no mass transport in the solution, and 5) there is no side reaction at the electrode interface due to electrochemical/thermal stability, thereby improving device reliability. The carbon quantum dot ionic compound of the present invention is not only easy to disperse in aqueous solutions and non-aqueous solvents, but also relatively free of mixing with organic solvents having low viscosity, low volatility, and high permittivity. Through above mentioned characteristics, the electrolyte in the present invention is deemed to have a highly ionic conductivity.

In the carbon quantum dot ionic compound of the present invention, the metal cation may be an alkali metal, an alkaline earth metal or a transition metal cation, and examples thereof may be Li, Na, K, Mg, or Zn. The carbon quantum dot ionic compound can be used in liquid, gel, solid form, and it is possible to adjust the appropriate content thereof according to the concrete usage.

The electrolyte comprising carbon quantum dot ion compound adapted in the electrochemical device of the present invention has an average diameter in the range of 2 to 12 nm, more preferably in the range of 5 to 8 nm, and at least one oxygen functional group being capable of an anion on the surface and/or the edge thereof, and a surface potential of less than or equal to −20 mV. If the average diameter of the carbon quantum dot is less than 2 nm, the carbon quantum dot anion would move to the anode by the potential formed on the electrode of the electrochemical device, which decreases the t+(ion transport number), resulting in a decrease in the efficiency of the electrochromic device and it will reduce the lattice energy of the carbon quantum dot resulting in ionic conductivity reduction. On the other hand, when the average diameter of carbon quantum dots is 12 nm or more, the π-π interaction between the carbon quantum dots increases, which causes aggregation and crystallization of carbon quantum dots in the electrochemical device and degrade the reliability of the device.

The electrolyte comprising carbon quantum dot ion compound in the present invention can be used as liquid by dissolving in water-soluble solvents (methanol, ethanol), non-aqueous solvents (acetonitrile, dimethyl carbonate, ethylene carbonate), and an aqueous solution, or optionally dispersed in a suitable dispersion medium/matrix dispersed as a gel form. The applicant of the present invention also have filed a patent application No. 10-2017-0064227 before KIPO regarding an electrolyte for electrochemical device comprising carbon quantum dot ionic compound and preparation method thereof. No more detailed explanation about carbon quantum dot ion compound in the specification, because one can refer said patent application for detail about it.

Figure 1:
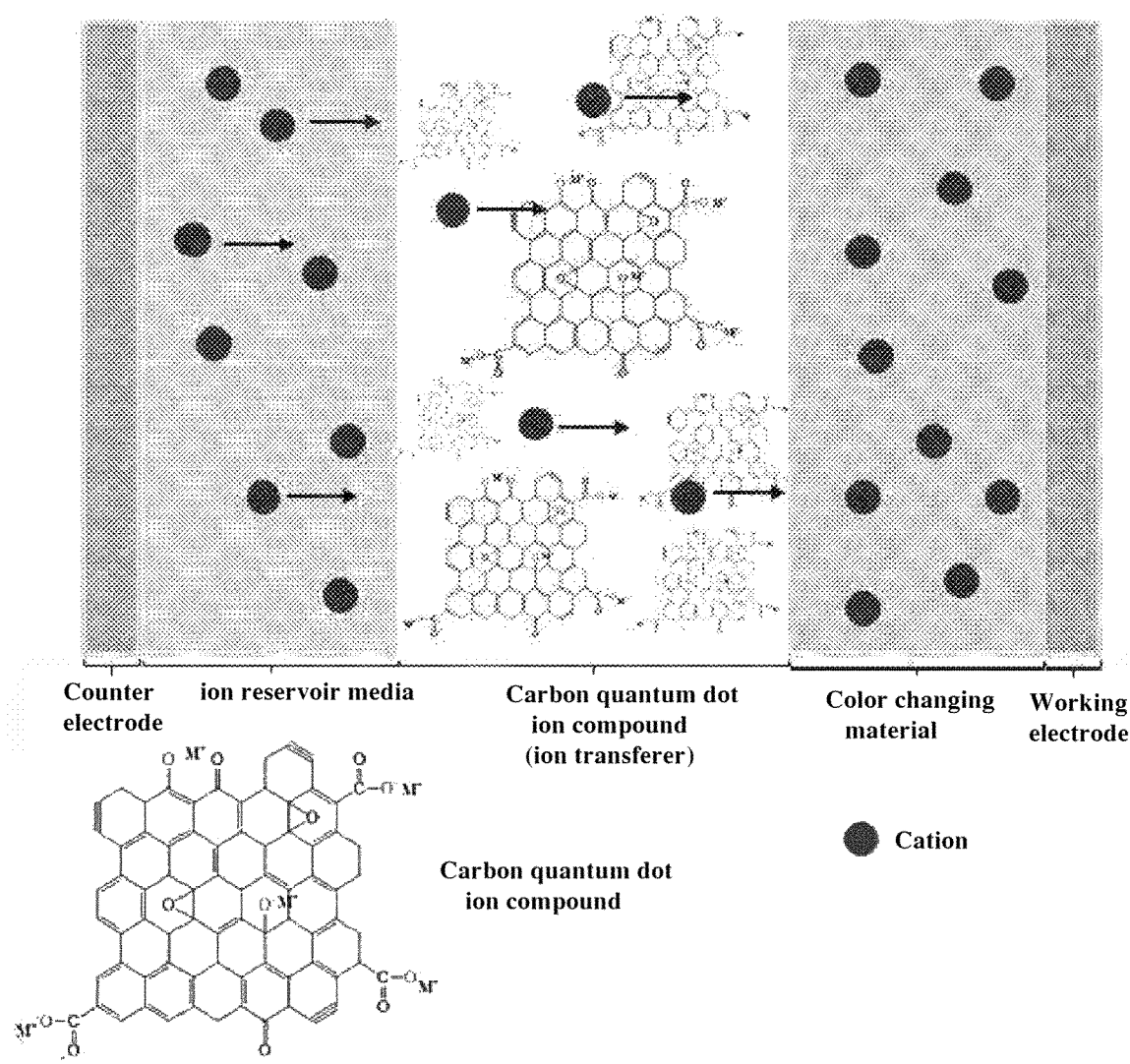
FIG. 1 is a schematic diagram of an electrochromic device according to the present invention.

FIG. 1 is a schematic diagram of an electrochromic device according to the present invention. As shown in FIG. 1, an electrochemical device according to the present invention comprises a first electrode; a second electrode spaced apart from the first electrode and forming an electrically opposite to the first electrode; and electrolyte filled between the first electrode and the second electrode, and may comprise reference electrode as well in accordance with the characteristic of the device. In an embodiment of the present invention, an electrochromic device is used as an example of an electrochemical device, but the electrochemical device of the present invention is not limited to an electrochromic device only, but can be an electrochemical light emitting device, a secondary battery, or a solar cell with reversible electrochemical redox reactions at the working electrode (material).

Due to the low diffusion coefficient and transport rate of the conventional electrolyte metal cation, the reliability and performance of the electrochemical device is degraded. For example, when the diffusion coefficient of the metal cation in the electrochromic device is lower than the cation constituting the ionic liquid, the cation cannot be inserted into the color change material. Therefore, the color change material is difficult to maintain an electrically neutral state, the color change efficiency is degraded or the decomposition of the material occurs, the electrochromic device reliability and performance is reduced. The electric field is formed by the voltage applied in the electrochromic device, which causes the electrolyte anions to move along the direction of the electric field. At this time, the negative ions cause chemical reaction with the discoloration material and the electrode, thereby reducing the reliability and performance of the electrochromic device. In the case of a two-electrode electrochromic device having a sandwich form, a material capable of an oxidation/reduction reaction should be included. Otherwise, charge imbalance occurs on both electrode interfaces, thereby degrading the reliability and performance of the electrochromic device. In the electrochemical device according to the present invention, among the electrochromic devices, by applying a carbon quantum dot ion compound as an electrolyte, the above-described side reactions can be suppressed to increase the reliability and durability of the electrochemical device, as well as the electrode and electrolyte (quality). By controlling the intercharge imbalance, the efficiency of the electrochromic device can be improved by increasing the conversion efficiency between electrical energy and chemical energy.

The present invention will be described below in greater detail in connection with preferred embodiments of the present invention. It should be noted that the following embodiments are provided merely for better understanding of the invention and the scope of the present invention is not limited only to the embodiments.

Example 1 (Preparation of Electrochromic Device Applying Carbon Quantum Dot Electrolyte)

A color change material layer was formed on a conductive transparent substrate by immersing the substrate in an aqueous solution containing 0.05 M HCl, 0.05 M $K_3Fe(CN)_6$, and 0.05 M $FeCl_3 \cdot 6 H_2O$. The thickness of the color change material layer can be regulated by controlling the current and time using chronopotentiometry. In the present invention, the color change material layer formed on the conductive transparent substrate used as working electrode with 40 uA and 140 s. On the other hand, ZnO buffer layer was formed by immersing another conductive transparent substrate in 5 mM $ZnCl_2$, 0.1 M KCl, and an oxygen-saturated aqueous solution for 1000 s while applying −1 V at room temperature. Subsequently, the ZnO buffer layered transparent electrode was immersed in 0.5 mM $ZnCl_2$, 0.1 M KCl and oxygen saturated water solution at 80° C. for 1000 s while applying −1 V, and then ZnO NW(nanowire)s layer was formed thereon, which was used as a relative electrode. Respective 3 working electrodes and the 3 relative electrodes were attached on the inside of the 3 electrochromic devices in the form of a sandwich using a thermal tape with the distance of 60 um between the two electrodes. Subsequently, through the fine holes formed in the second electrode, 0.5M solutions of carbon quantum dot ionic compound of with respective Li, Na, and K were injected into the corresponding electrochromic device. The pH of the aqueous electrolyte solutions were adjusted to 4, respectively.

Comparative Example 1 (Manufacture of Electrochromic Device Including Potassium Chloride Electrolyte)

An electrochromic device was manufactured in the same manner as in Example 1, except that 0.5 M potassium chloride (KCl) was used as the electrolyte.

Figure 3:
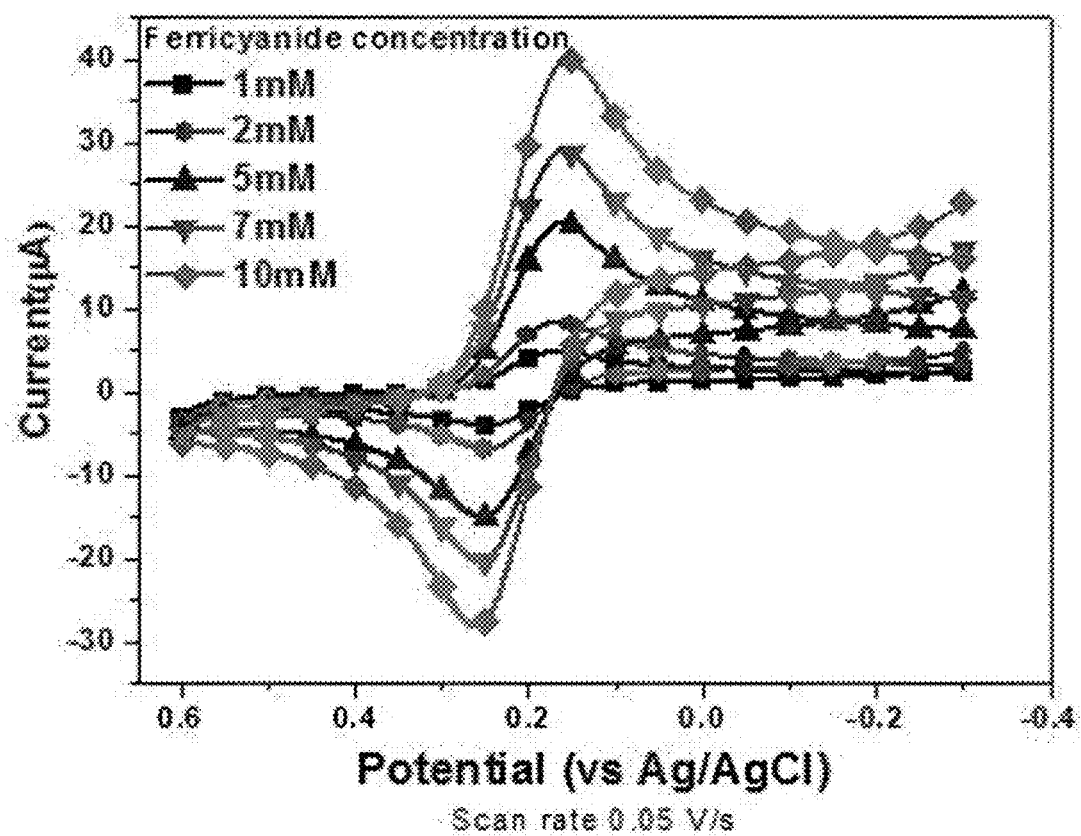
FIG. 3 (a) shows a structure diagram of a three-electrode system composed of a first electrode (working electrode), a platinum (Pt) second electrode (relative electrode) and reference electrodes (Ag/AgCl) and containing a color change material in an aqueous solution comprising a carbon quantum dot ionic compound of the present invention, and (b) shows the results of cyclic voltammograms with 0.1 V/s scan rate using said three-electrode system.
Figure 4A:
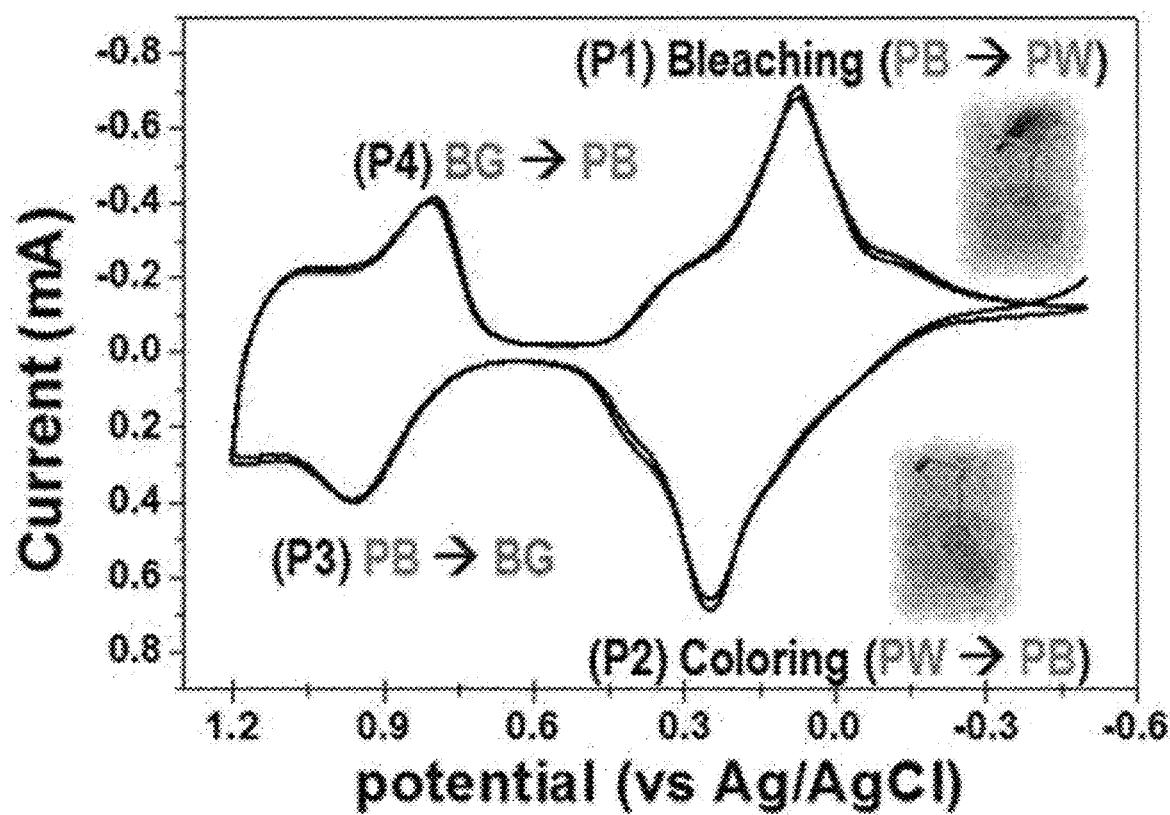
FIG. 4(a) is the results of cyclic voltammogram with 0.02 V/s scan rate using the three-electrode system with Prussian blue coated working electrode, and (b) is the result of measuring current change with varying scan rate.
Figure 4B:
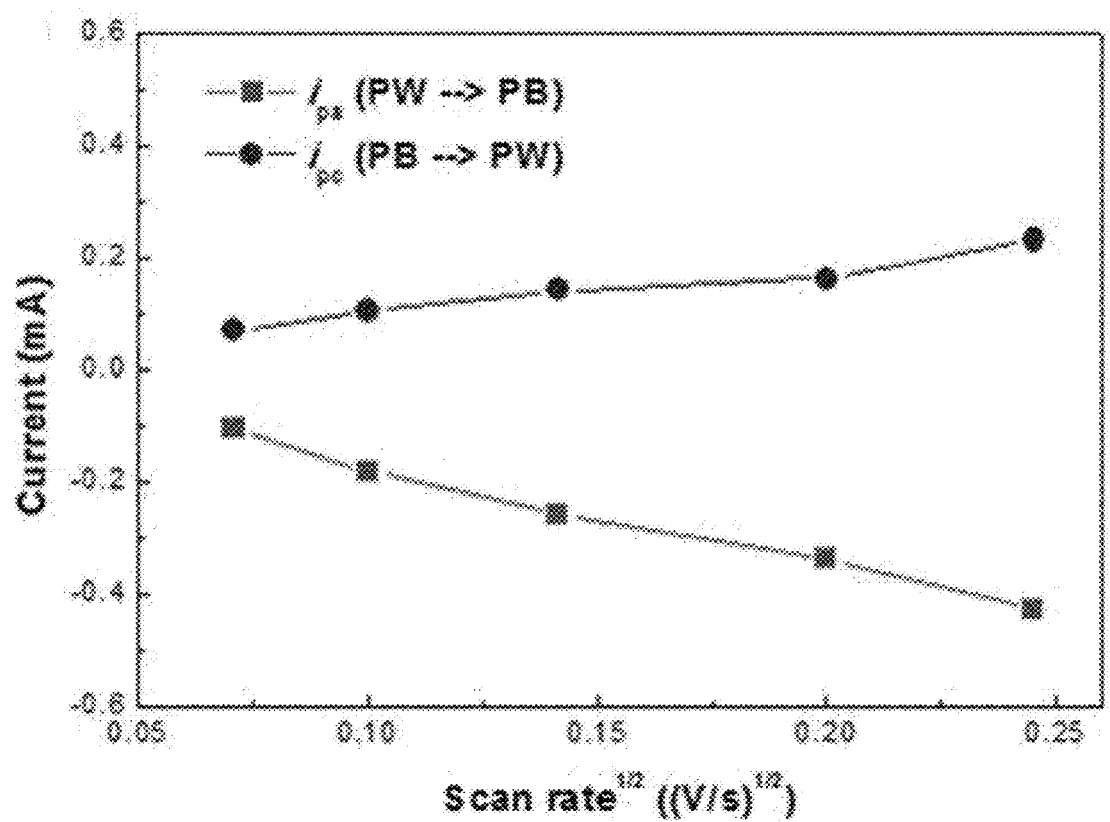

Electrochemical properties of the electrochromic devices prepared in Example 1 and Comparative Example 1 were compared. FIG. 3 (a) shows a structure diagram of a three-electrode system composed of a first electrode (working electrode), a platinum (Pt) second electrode (relative electrode) and reference electrodes (Ag/AgCl) and containing a color change material in an aqueous solution comprising a carbon quantum dot ionic compound of the present invention, and (b) shows the results of cyclic voltammograms with 0.1 V/s scan rate using said three-electrode system. FIG. 4(a) is the results of cyclic voltammogram with 0.02 V/s scan rate using the three-electrode system with Prussian blue coated working electrode, and (b) is the result of measuring current change with varying scan rate And the characteristics of the electrochromic device were analyzed by applying voltage at −0.14/0.4 V and 10 s/10 s (50% duty cycle) using a chronoamperometry method. As shown in FIG. 4(b), in the electrochemical device of the present invention, it can be seen that the oxidation/reduction current of the color change material corresponds to the same even when the scanning rate is increased (the oxidation is a coloration reaction (PB) and the reductive current is a decoloration reaction (PW)). Table 1 below shows the diffusion rate according to the metal cations of the carbon quantum dot ionic compound under the three-electrode system conditions.

TABLE 1

|  |  | 0.5M KCl | 0.5M K$^+$-C-dots$^-$ | 0.5M Na$^+$-C-dots$^-$ | 0.5M Li$^+$-C-dots$^-$ |
|---|---|---|---|---|---|
| Diffusion rate $D_0$ (cm$^2$/s) | PB→PW | 2.7 × 10$^{-10}$ | 7.7 × 10$^{-11}$ | 2.0 × 10$^{-10}$ | 1.8 × 10$^{-12}$ |
|  | PW→PB | 7.8 × 10$^{-10}$ | 3.3 × 10$^{-10}$ | 6.8 × 10$^{-10}$ | 3.4 × 10$^{-10}$ |

Figure 5:
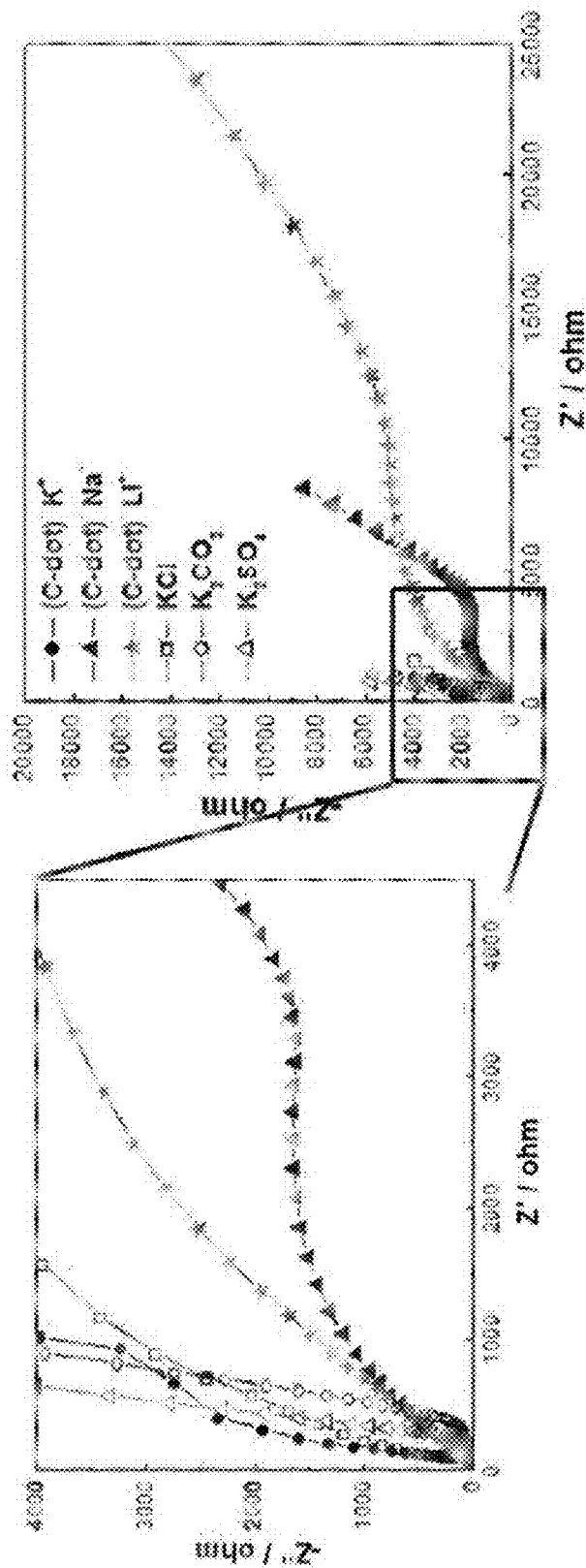
FIG. 5 is an electrochemical impedance spectroscopy of the electrochemical device of Example 1 and comparative example 1 measured by changing metal cations in carbon quantum dot ionic compounds using the three-electrode system.

FIG. 5 is an electrochemical impedance spectroscopy of the electrochemical devices measured by changing metal cations in carbon quantum dot ionic compounds using three electrode system, and Table 2 summarizes the measured impedance measurements with coloration reaction (PB) and decoloration reaction (PW) using the circulating current voltage method in the three-electrode system.

TABLE 2

|  |  | 0.5M KCl | 0.5M K$^+$-C-dots$^-$ | 0.5M Na$^+$-C-dots$^-$ | 0.5M Li$^+$-C-dots$^-$ |
|---|---|---|---|---|---|
| D$^0$(cm$^2$/s) | PB→PW | 2.7 × 10$^{-10}$ | 7.7 × 10$^{-11}$ | 2.0 × 10$^{-10}$ | 1.8 × 10$^{-12}$ |
|  | PW→PB | 7.8 × 10$^{-10}$ | 3.3 × 10$^{-10}$ | 6.8 × 10$^{-10}$ | 3.4 × 10$^{-10}$ |
| PB→PW Intercalation | $R_s$ (W) | 34 | 34 | 45 | 71 |
|  | $R_{ct}$ (W) | 62 | 52 | 285 | 359 |
| PW→PB Detercalation | $R_s$ (W) | 33 | 35 | 46 | 72 |
|  | $R_{ct}$ (W) | 80 | 53 | 1585 | 4949 |

Figure 7A:
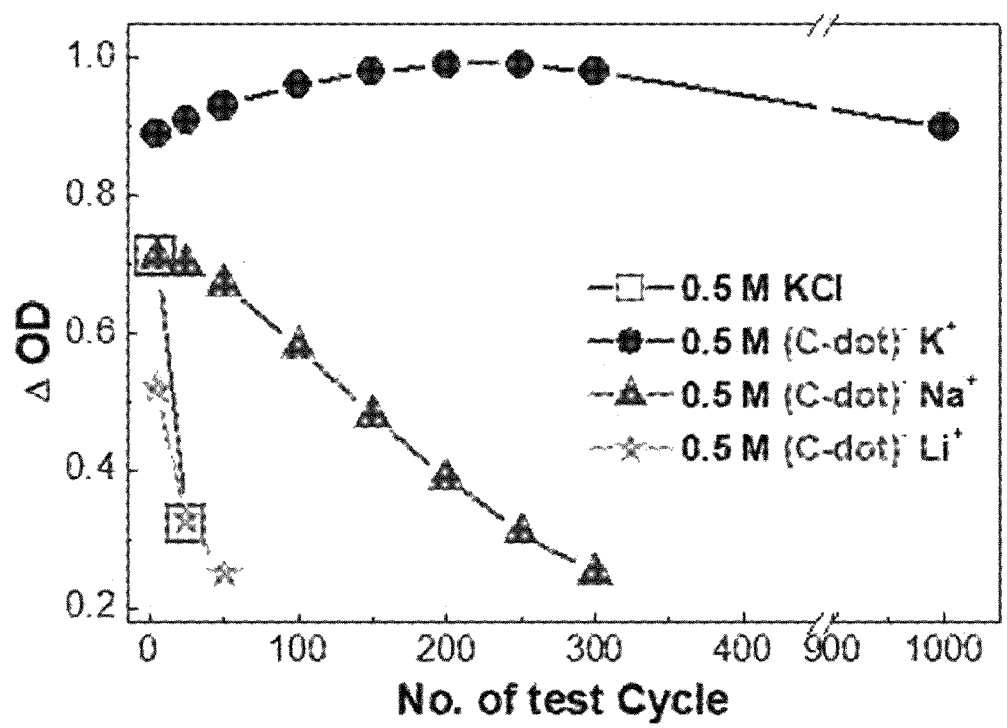
FIG. 7(a) shows the result of durability test for each electrolyte in the electrochromic device according to the present invention and (b) is the result of durability test for the carbon quantum anion-potassium cation electrolyte.
Figure 7B:
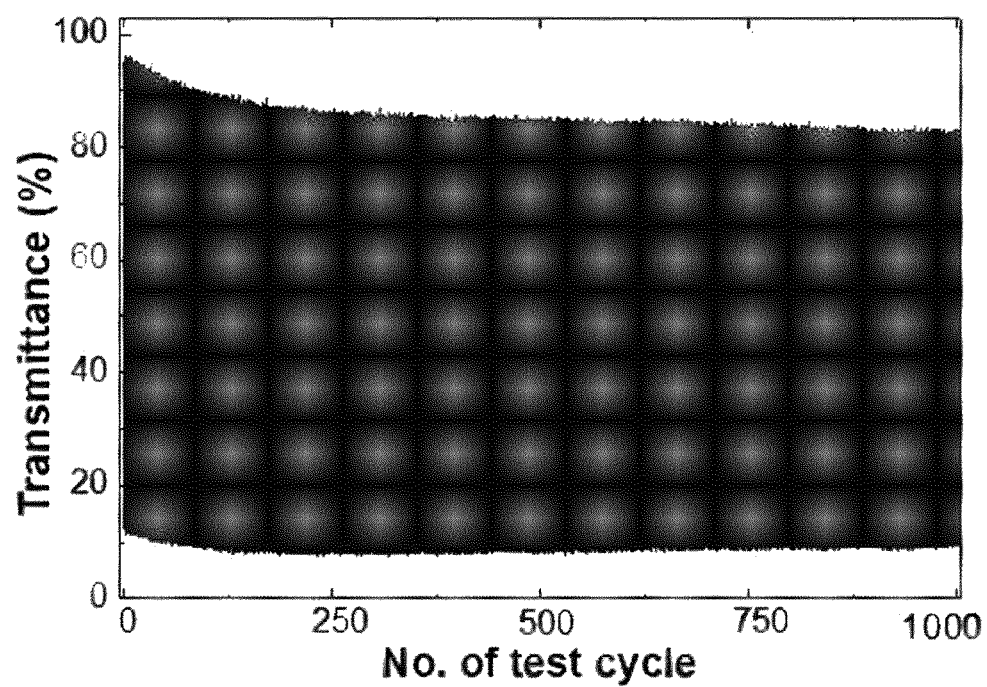

The durability of the electrochromic devices prepared in Example 1 and Comparative Example 1 was tested. FIG. 7 shows the test result of electrolyte durability of an electrochromic device, which is an example of electrochemical devices manufactured in Examples and Comparative Examples according to the present invention. As can be seen in FIG. 7, it can be seen that color change efficiency maintained constant even after 1000 cycles in the electrochromic device using a electrolyte, (C-dot)$^-$K$^+$, according to the present invention, whereas the color change efficiency is reduced to less than the initial half level within 50 cycles in the electrochromic device using a conventional KCl electrolyte. This means that the electrochromic device using the (C-dot)$^-$K$^+$ electrolyte has excellent durability. Specifically, it can be concluded that (1) the (C-dot)$^-$K$^+$ ionic compound serves as an electrolyte, (2) the electrochemical durability of the (C-dot)$^-$K$^+$ electrolyte is excellent, and (3) less electrochemical side reactions are induced in device. Coloration efficiency (CE) is determined by the change in absorbance from the amount of charge required for a chromogenic or discolored state ($\Delta$OD ($\lambda$)=log $T_b/T_c$, $T_b$ and $T_c$ means transmittance at 700 nm). The discoloration efficiency values of 0.5 M KCl and (C-dot)$^-$K$^+$ electrolyte were 81.6 cm$^2$/C and 103.0 cm$^2$/C, respectively. Therefore, it can be concluded that electrochromic devices using a carbon quantum dot ionic compounds are relatively superior in electrochromic stability and discoloration efficiency than that using KCl electrolyte. Table 3 summarizes the changes in absorbance and so forth.

Figure 6:
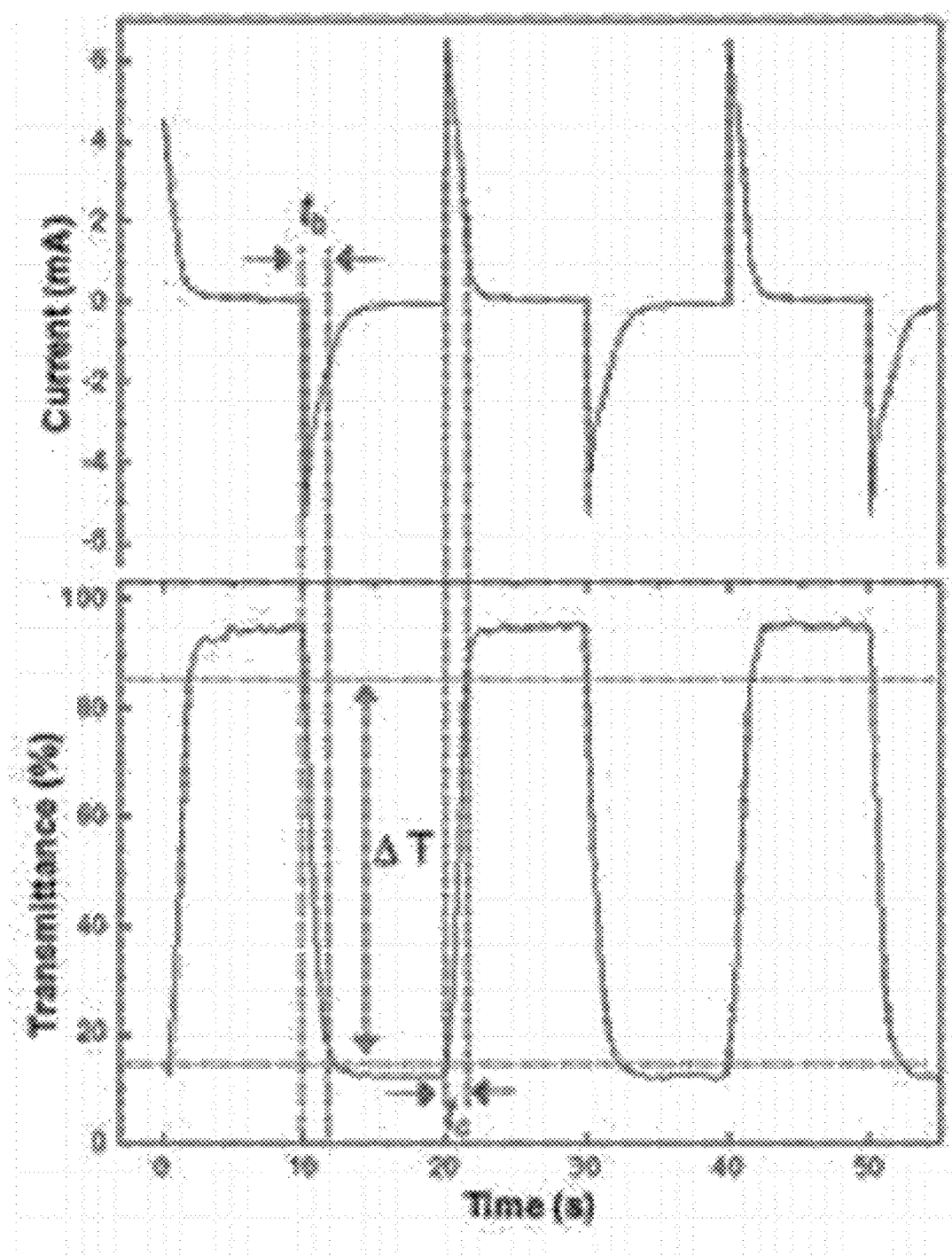
FIG. 6 shows the results of transmittance at 700 nm and current change measurement with voltage switching between −0.16V(discoloring state) and +0.4V(coloring state) for the electrochromic device inducing 1.2V to −2.2V pulse with 10 sec interval to produce color change.

In order to apply to the actual electrochromic device system, the characteristics of the sandwich type electrochromic device were evaluated. In the device test, the change in device transmittance at 700 nm was monitored according to the applied voltage change. The device generates a discoloration reaction by applying a pulse voltage of 1.2 V (colored state) to −2.2 V (colored state) with a pulse width of 10 seconds(FIG. 6). Theoretically, compared to the electrochromic device of the three-electrode system, the sandwich type electrochromic device shows a relatively high voltage charge injection due to the voltage drop phenomenon.

TABLE 3

|  | $\Delta$OD log(Tb/Tc) | $\eta$(cm$^2$/C) ($\Delta$OD/$\Delta$Q) | $\Delta$T(%) ($\lambda$ = 700 nm) | $t_b$(s) | $t_c$(c) | $\Delta T_{200\ cycle}$ (%) | $\Delta T_{300\ cy/ce}$ (%) |
|---|---|---|---|---|---|---|---|
| 0.5M KCl | 0.71 | 81.6 | 67 | 1.9 | 3.0 | — | — |
| 1.0M KCl | 0.96 | 110.5 | 92 | 1.7 | 2.5 | 5 | — |
| 0.5M K$^+$-C-dots$^-$ | 0.89 | 103.0 | 85 | 1.6 | 2.8 | 99 | 98 |
| 0.5M Na$^+$-C-dots$^-$ | 0.71 | 84.0 | 66 | 2.4 | 2.6 | 39 | — |
| 0.5M Li$^+$-C-dots$^-$ | 0.52 | 78.7 | — | — | — | — | — |

Figure 8:
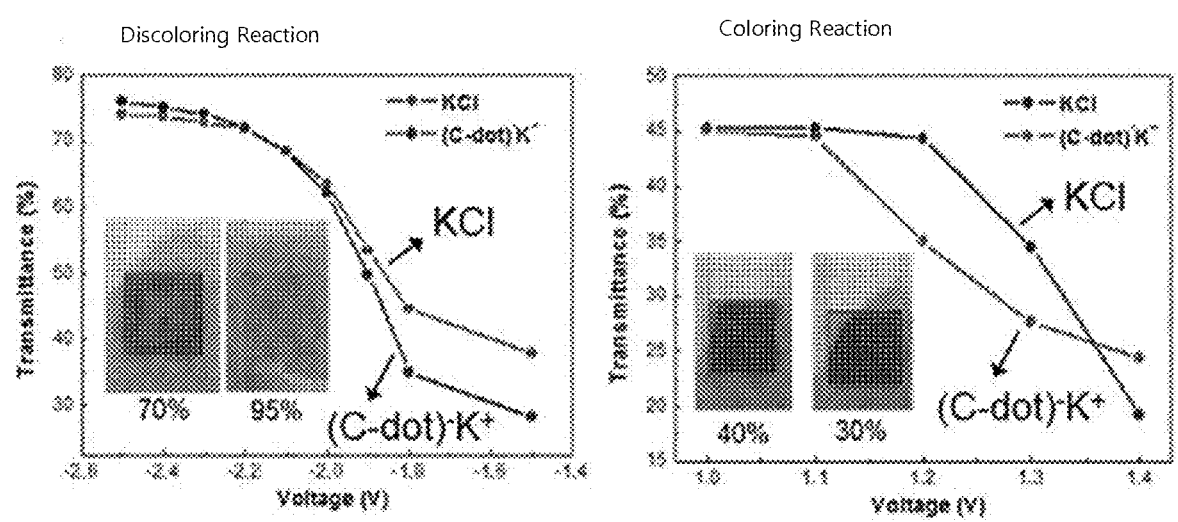
FIG. 8 shows the results of transmittance change measurement with voltage switching in an electrochromic device, and photographs of coloring/discoloring according to transmittance of the electrochromic device.

FIG. 8 shows the results of transmittance change measurement with voltage switching in an electrochromic device, and inserted photographs of coloring/discoloring according to transmittance of the electrochromic device. As shown in FIG. 8, the electrochromic device comprising carbon quantum anion-metal cation ion compound electrolyte of the present invention shows excellent performance, and in particular, durability compared to that adopting a conventional electrolyte.

Example 3 (Electrochemical Light Emitting Device)

An electrochemical light emitting device was prepared ad follows;
(1) Forming a thin film of TiO2 particles on the surface of the cathode.
(2) Performing heat treatment on the TiO2 thin film coated cathode at 120° C. for 10 minutes in order to increase the conductivity and transmittance.
(3) Immersing the cathode in which the TiO2 thin film was formed in an emitting material solution for 55° C. for 6 hours.
(4) After 6 hours, washing the surface of the cathode with ethanol.
(5) Attaching the cathode and anode inside the device using a thermal tape respectively.
(6) Injecting solution containing the light-emitting material and the electrolyte through the hole formed in the anode.
(7) Sealing the hole.

Figure 9:
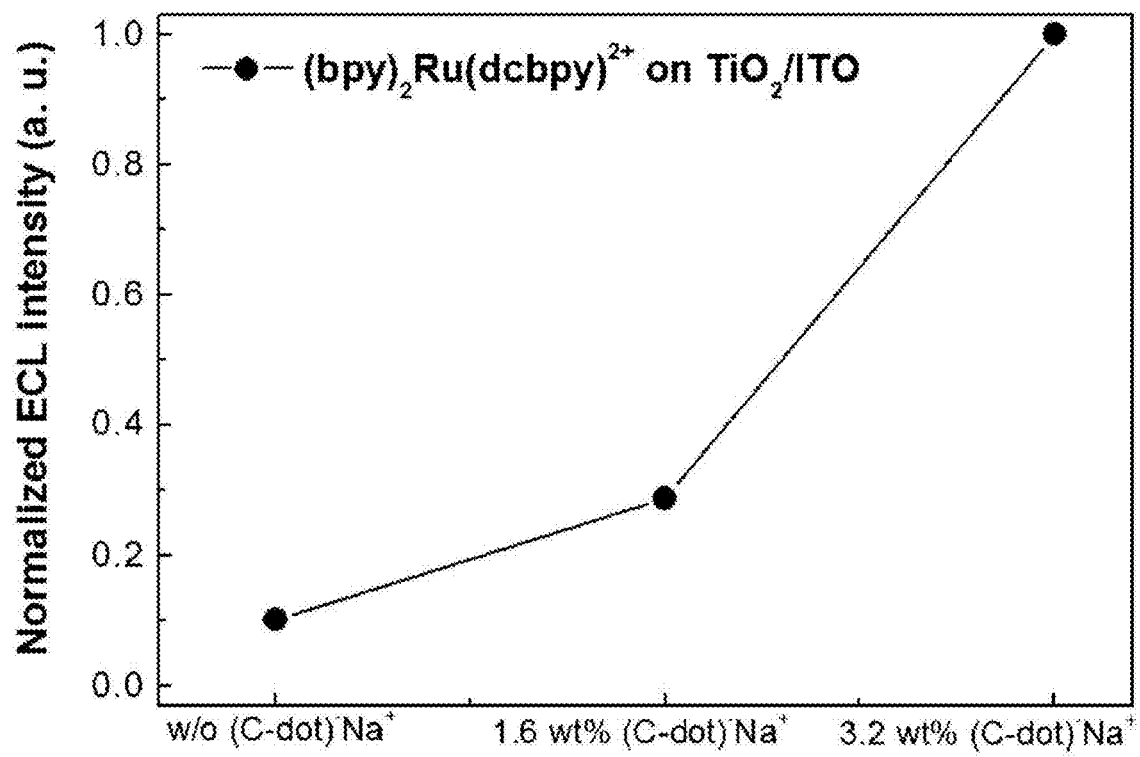
FIG. 9 shows a light emission intensity measurement result according to the carbon quantum dot ion compound concentration under the two-electrode system conditions for the electroluminescent device in one embodiment according to the present invention.

FIG. 9 shows a light emission intensity measurement result according to the carbon quantum dot ion compound concentration under the two-electrode system conditions for the electroluminescent device in one embodiment according to the present invention. As can be seen in FIG. 9, as the carbon quantum point anion-metal cation ion compound concentration is increased, the ionic conductivity is improved, thereby reducing the resistance in the device and eventually increasing the luminescence intensity.

Example 4 (Lithium Secondary Battery)

Figure 10:
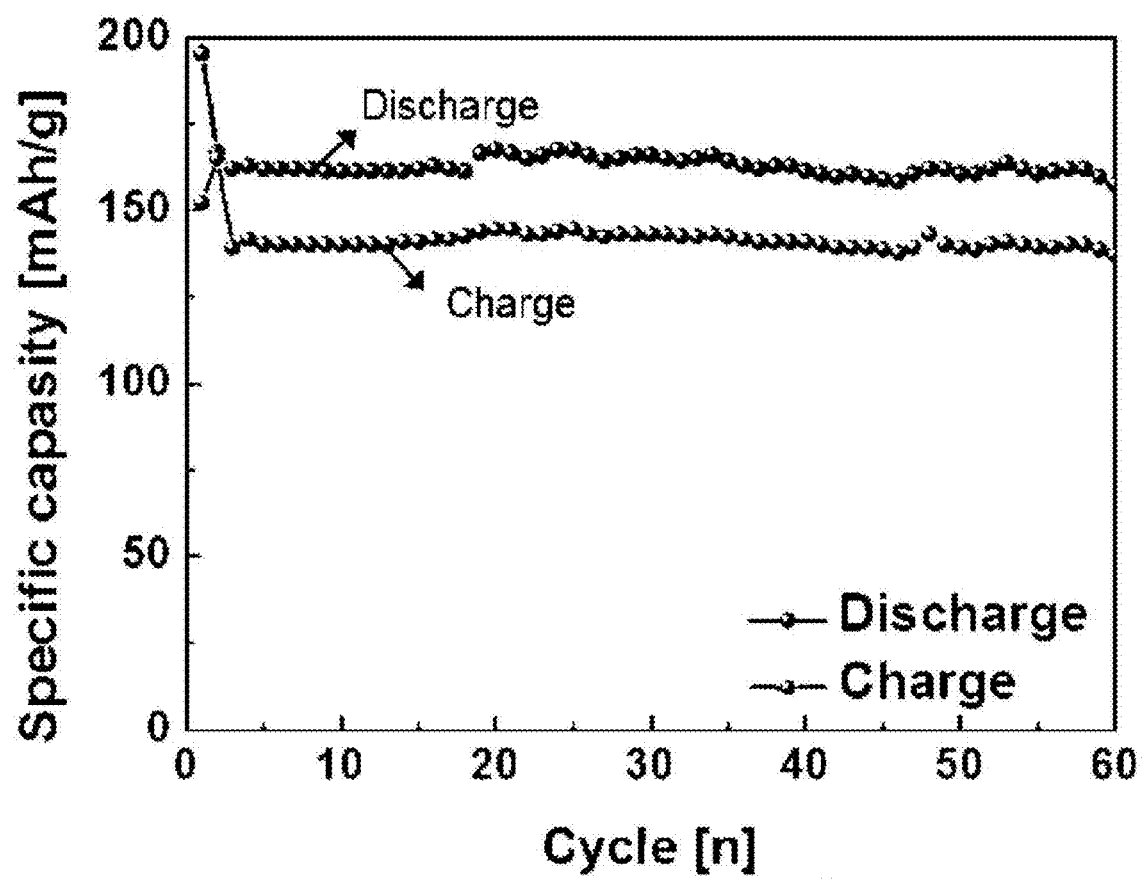
FIG. 10 shows charge/discharge test result of a lithium secondary battery according to the present invention applying a carbon quantum dot ion compound.
Figure 11A:
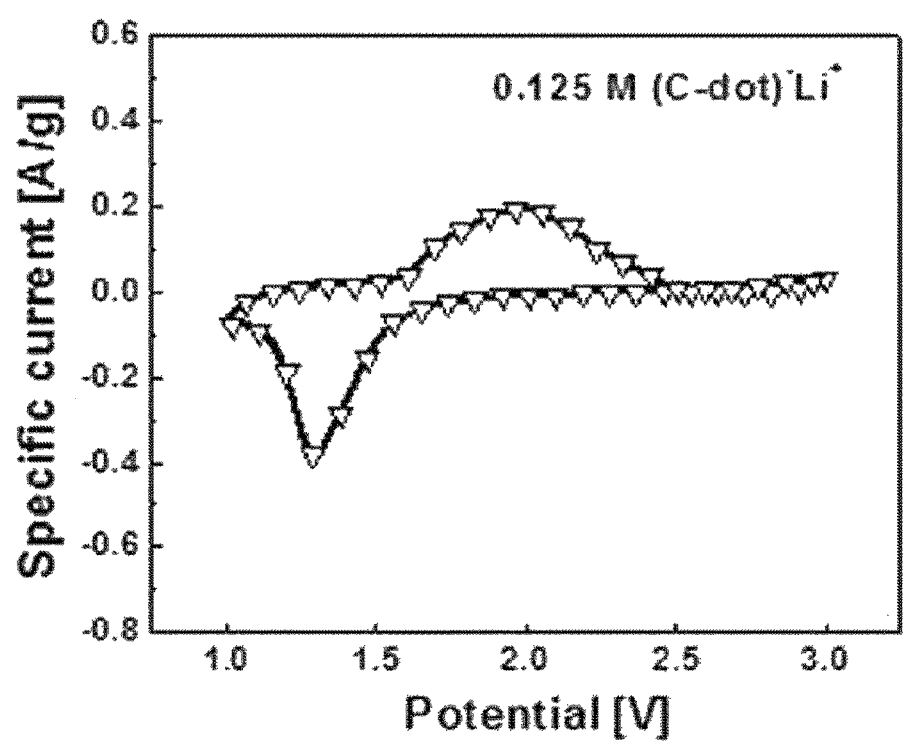
FIG. 11 (a) to (c) show cyclic voltammetry measurements with varying the concentrations (0.125, 0.25 and 0.5M, respectively) of the carbon quantum dot anion-lithium cation ion compound electrolyte prepared according to the present invention.
Figure 11B:
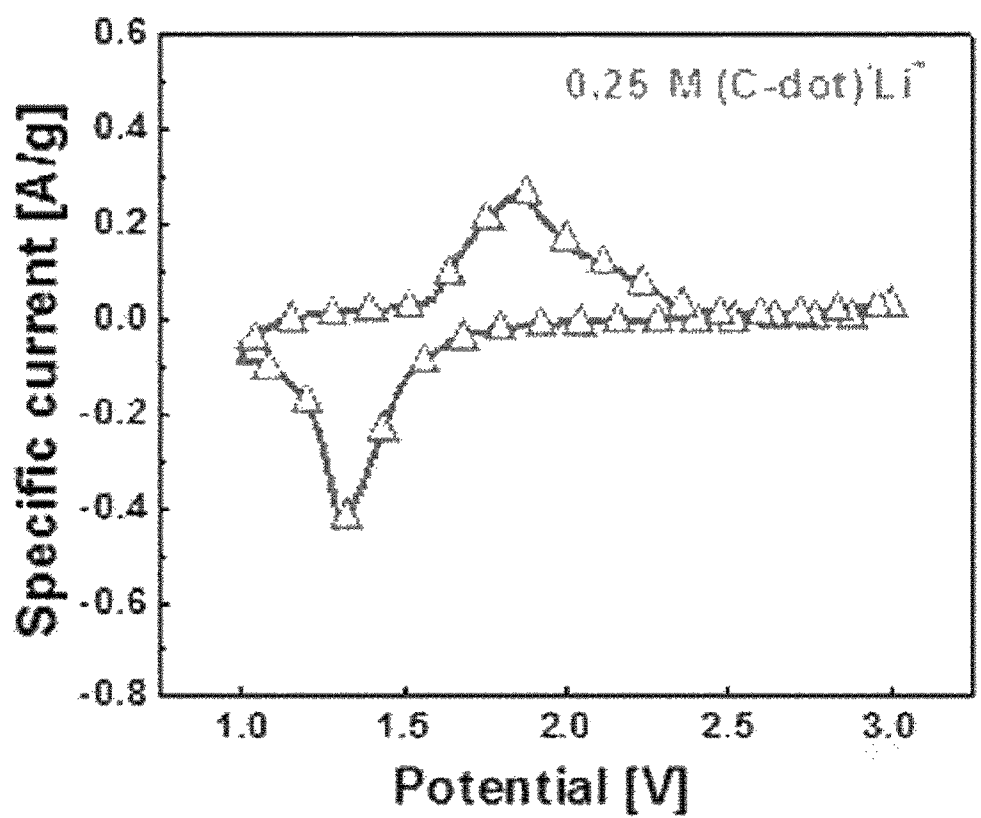
Figure 11C:
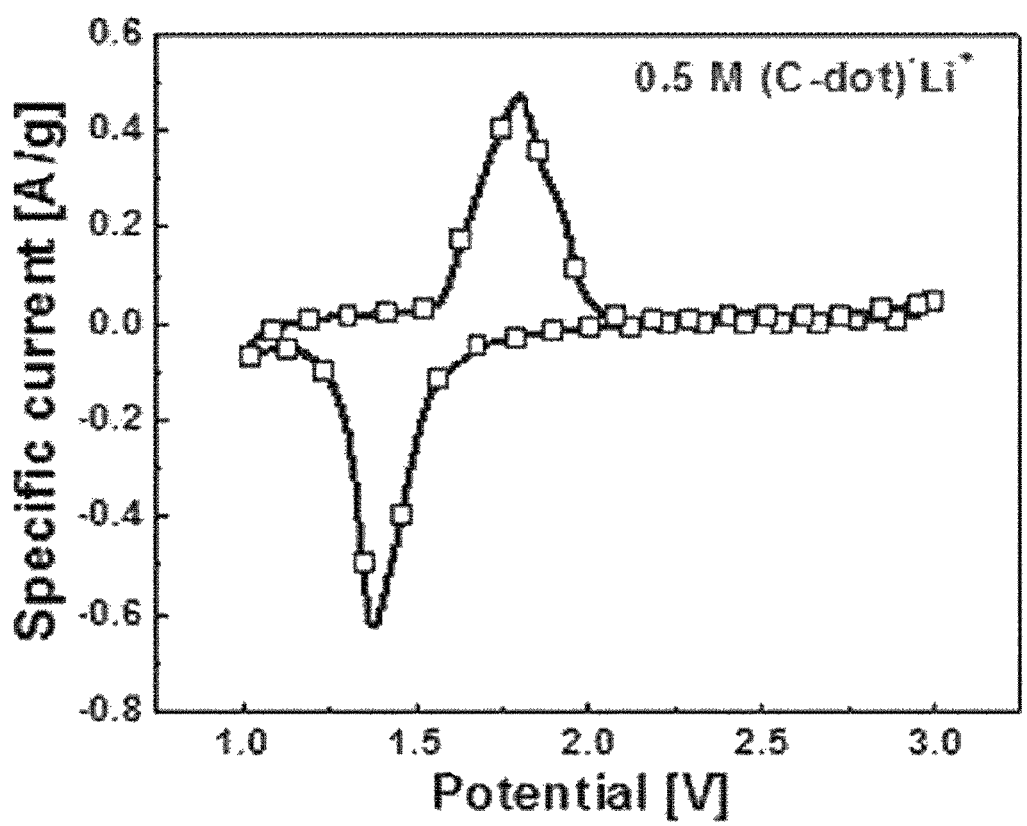
Figure 11D:
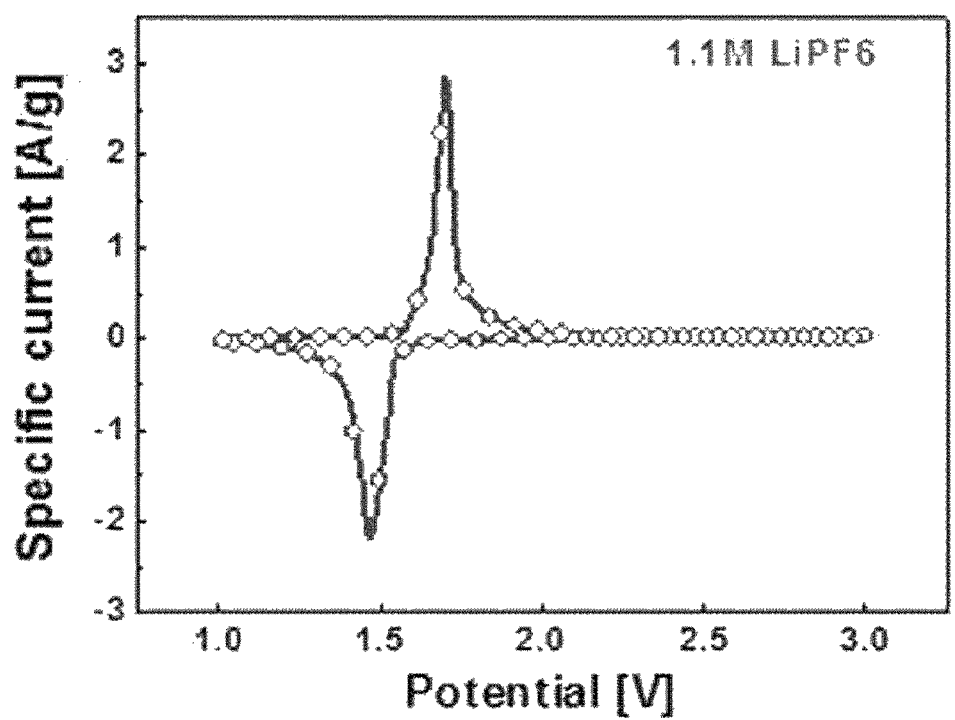

FIG. 10 shows the results of measuring the specific capacitance with charging and discharging the lithium secondary battery applying the carbon quantum anion-lithium metal cation ion compound electrolyte of the present invention instead of $LiPF_6$ electrolyte of the conventional secondary battery. The anode of the battery was constructed using $Li_4Ti_5O_{12}$ (active material, LTO), 10 wt. % PVDF (binder) and NMP (Solvent), and the cathode was graphite. The concentration of the carbon quantum point anion-lithium metal cation ion compound electrolyte was 0.5M. As shown in FIG. 10, it was found that a stable charge/discharge cycle is observed in the secondary battery.

Example 5 (Lithium Secondary Battery Electrolyte Evaluation)

In order to check the characteristics of the electrolyte, various experiments were performed on the lithium ion battery of above Example 4. First, a cyclic voltammetry was performed with varying concentrations of an electrolyte applied to a lithium ion battery. FIGS. 11 (a) to 11 (c) show cyclic voltammetry measurements with varying the concentrations (0.125, 0.25 and 0.5M, respectively) of the carbon quantum dot anion-lithium cation ion compound electrolyte prepared according to the present invention. As shown in FIG. 11, the higher the electrolyte concentration (the higher the content) shows the same tendency as shown in the charge and discharge data, and it can be seen that the difference in electrochemical performance. Although that of 0.25M sample showed unstable in the anodic region from 2.5 V or higher, that of 0.5M sample, though it was slightly shifted from 1.6 V, which is the theoretical Li ion intercalation/deintercalation region of the LTO, shows distinct anodic/cathodic peaks. Table 4 below shows the results of measuring polarization according to each concentration.

TABLE 4

|  | 0.125 | 0.25 | 0.5 |
|---|---|---|---|
| Polarization | 0.715 V | 0.542 V | 0.43 V |

Figure 12A:
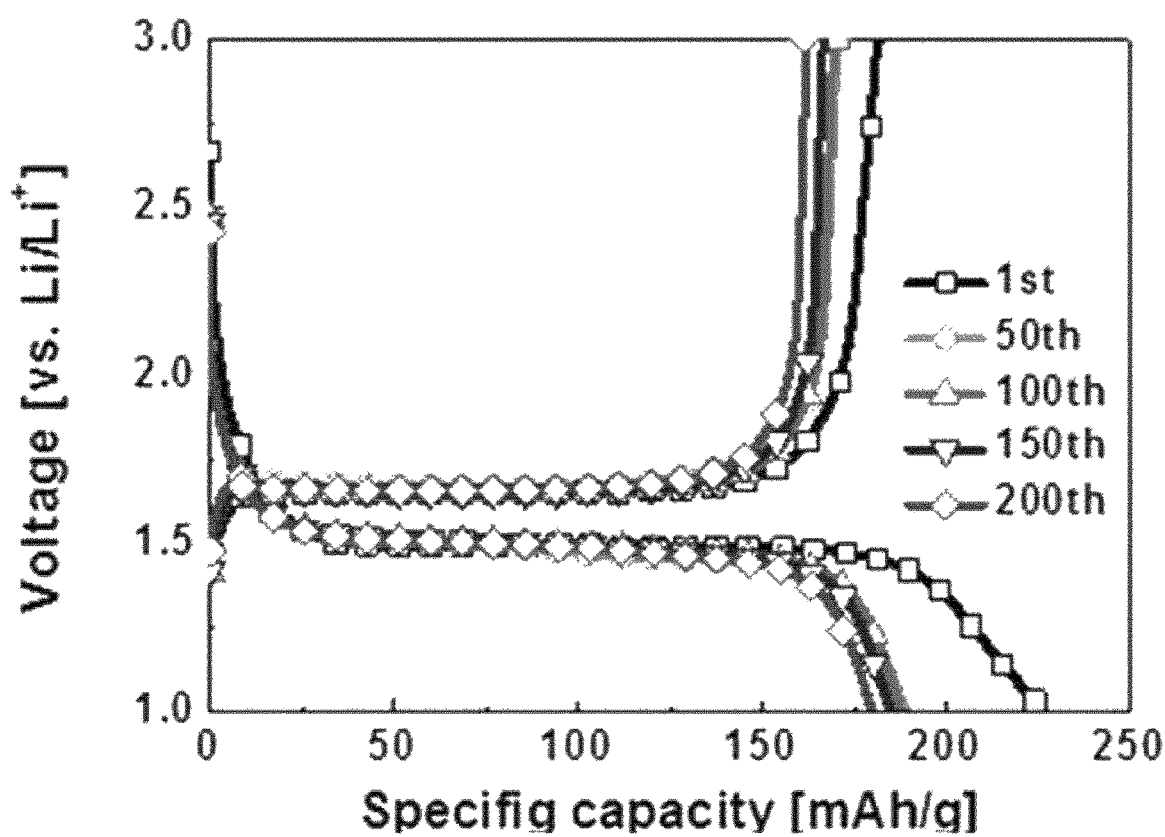
FIG. 12 (a) shows the results of cycling test under the condition of the current density of 160 mA/g in one embodiment of the present invention and (b) the result of measuring the change of the current density by concentration.
Figure 12B:
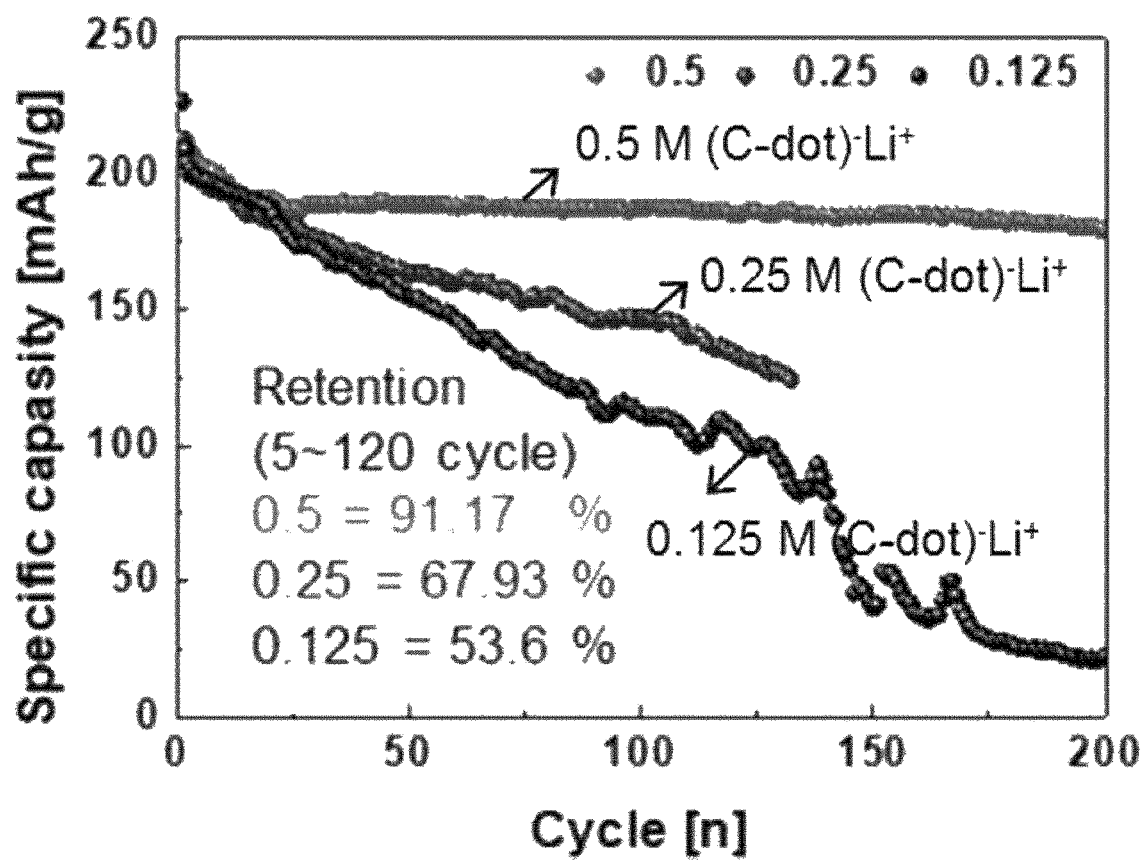

In order to determine the rate characteristic of the electrolyte according to each concentration, charge and discharge cycling was performed at various current densities of 80 to 400 mA/g, and the results are shown in FIG. 12. FIG. 12 (a) is the result of the 0.5M concentration electrolyte, (b) is the result of measuring the cycle for each concentration. As can be seen in FIG. 15, the rate characteristic of the relatively high concentration of 0.5M sample was the best. When calculating the average capacity for each current density, that of 0.5M sample is the best at all current density. The results were summarized in Table 5.

TABLE 5

|  | 0.125 | 0.25 | 0.5 |
|---|---|---|---|
| 80 mA/g | 193.47 | 194.28 | 194.33 |
| 160 mA/g | 166.45 | 161.96 | 171.67 |
| 240 mA/g | 148.38 | 151.61 | 162 |
| 320 mA/g | 121.36 | 134.46 | 149.33 |
| 400 mA/g | 78.91 | 104.28 | 134.33 |

As can be seen from Table 5, in particular, when the current density of 320, 400 mA/g, the performance of each sample shows the largest difference, which is due to the concentration of the electrolyte, that is, the difference in the content of Li ions.

Figure 13A:
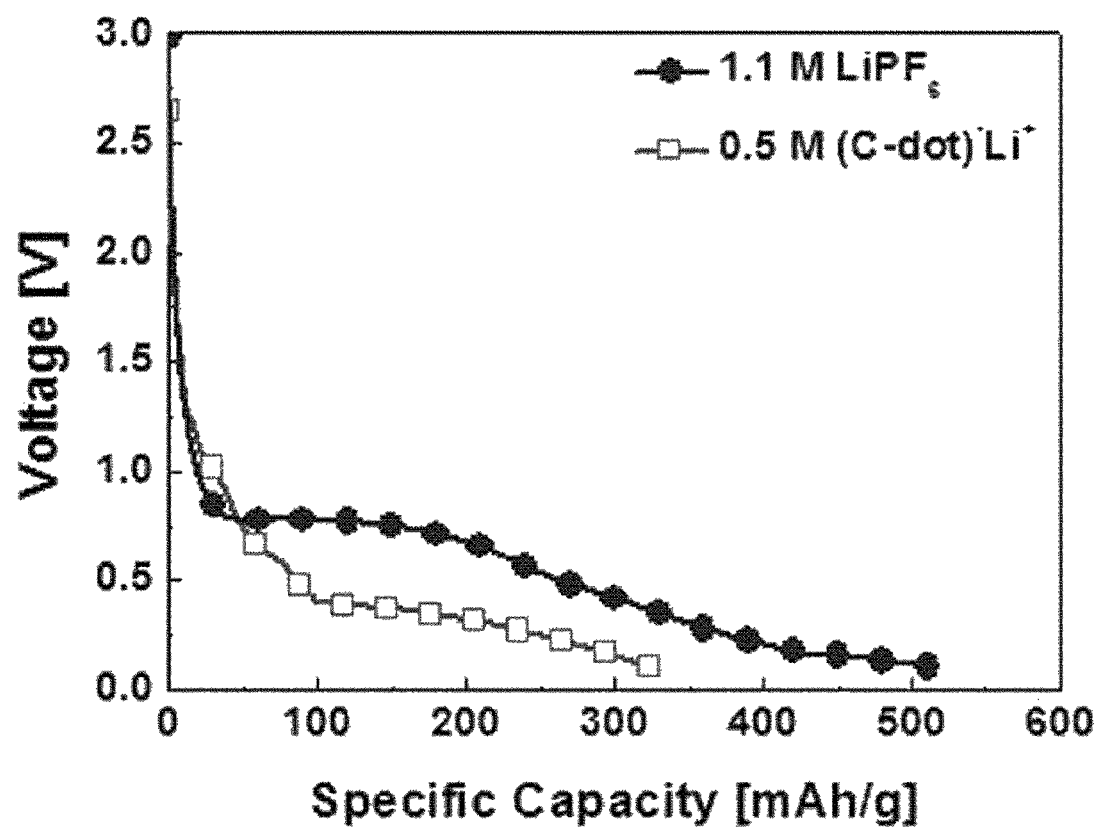
FIG. 13 (a) shows voltage-capacitance measurement results measured at an electrode of both lithium ion batteries applying a carbon quantum dot ion compound electrolyte and a $LiPF_6$ electrolyte respectively in Example 5 of the present invention and (b) is differential result with respect to voltage.
Figure 13B:
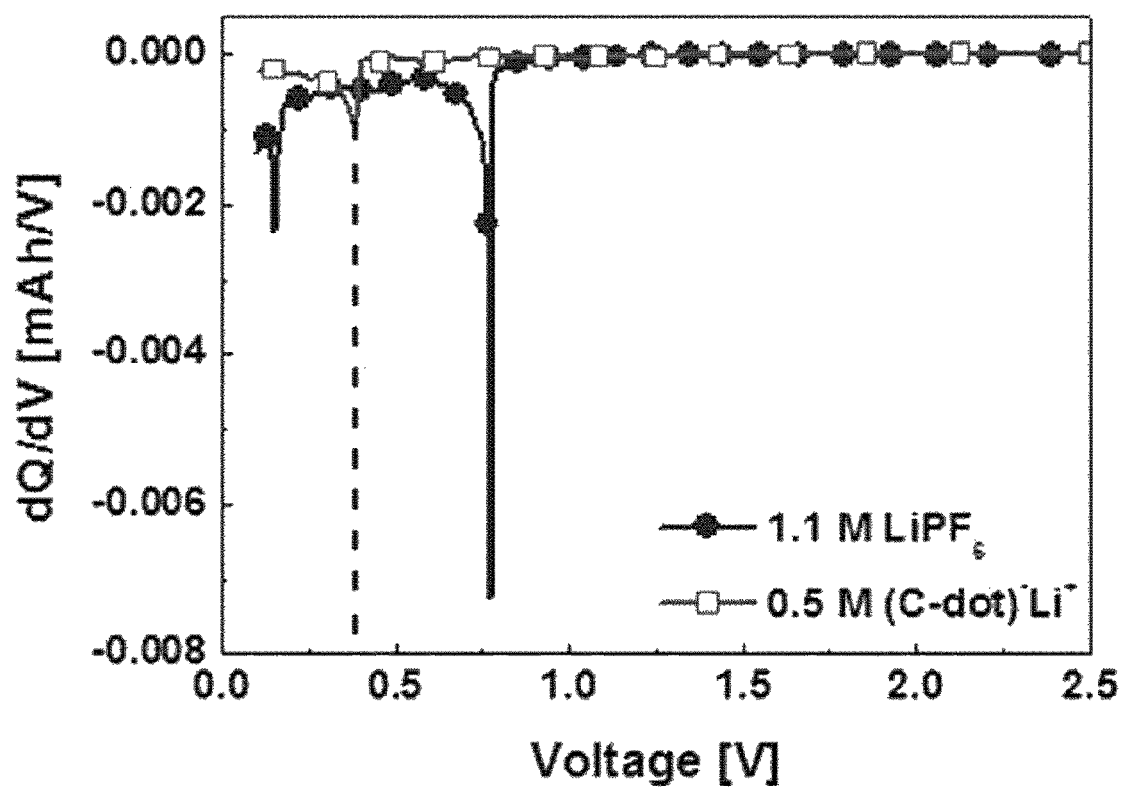

In addition, the specific capacity change of the Li metal (anode)/electrolyte/graphite (cathode) battery system was observed while changing the voltage after constructing the half cell system in the lithium ion battery of Example 4. For comparison, a lithium ion battery employing $LiPF_6$ as an electrolyte was prepared and the same observation was performed. FIG. 13 (a) shows voltage-capacitance measurement results measured at an electrode of both lithium ion batteries applying a carbon quantum dot ion compound electrolyte and a $LiPF_6$ electrolyte respectively in Example 5 of the present invention and (b) is differential result with respect to voltage. As shown in FIG. 13, when $LiPF_6$ was used as an electrolyte, a reaction estimated to form SEI was observed at 0.75 V, whereas when a carbon-dots electrolyte is used, a reaction at 0.75 V was not observed, but observed at 0.5 V estimated by reaction of graphite and Li.

The ion mobility of lithium ions was measured also. Equation 1 below is a formula for obtaining the ion mobility index of the cation. The equation is represented by a number from 0 to 1, and the closer to 1, the higher the contribution of charge transfer by cation.

$$t_C = \frac{I_C}{I_C + I_A} \qquad \text{[Equation 1]}$$

Where $t_C$=Cation transference number, $I_C$=Current carried by cations, $I_A$=Current carried by anions Equation 1 may be expressed as Equation 2 below to measure the ion mobility index of Li ions.

$$t_{Li} = \frac{I_{SS}(V - I_O R_O)}{I_O(V - I_{SS} R_{SS})} \quad \text{[Equation 2]}$$

In equation 2, $t_{Li}$=Lithium transference number, V=Applied potential, $R_O$=Initial resistance of the passivation layer, $R_{SS}$=Resistance of the passivation layer, $I_O$=Initial current, $I_{SS}$=Steady state current.

Figure 14:
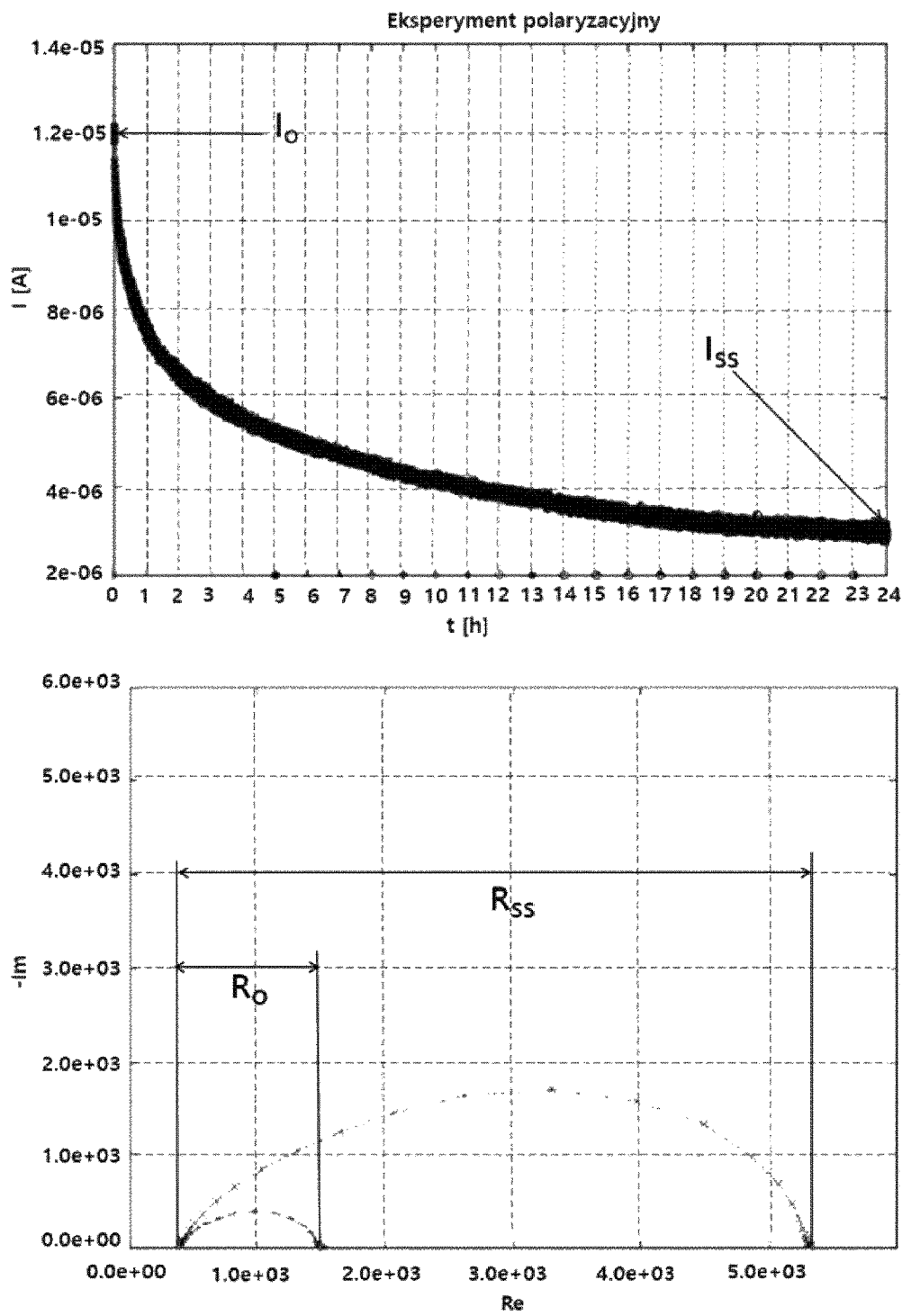
FIG. 14 shows the result of measuring $I_0$ and $I_{ss}$ (top) and $R_0$ and $R_{ss}$ (bottom) in order to calculate the charge transfer index of lithium ions in the lithium ion battery applying the electrolyte of the present invention.

A symmetrical cell of Li metal/electrolyte/Li metal was prepared, and initial impedance $R_O$ was measured(frequency range: 100 kHz-0.1 Hz), DC polarization experiment was performed at 0.05 mV to measure $I_{SS}$, $I_O$, and the impedance was measured again to determine $R_{SS}$. And the result of that using $LiPF_6$ as the electrolyte in the same manner was measured as a comparative example. FIG. 14 and Table 6 summarize the results.

TABLE 6

| | (Carbon-dots)$^-$Li$_x^+$ | $LiPF_6$ |
|---|---|---|
| $t_{Li}$ | 0.77 ± 0.1 | 0.44 |

As can be seen in FIG. 14 and Table 6, the carbon quantum dot anion-lithium cation ionic compound electrolyte of the present invention was found to be 1.5 to 2 times higher charge transfer index by the cation than $LiPF_6$. Considering that a smaller $t_{Li}$ increases the overall resistance of the cell due to concentration polarization of anions in the electrolyte and the cation yield may be affected by the temperature, the concentration of salt in the electrolyte and the radius of the ions, the high $t_h$ of the electrolyte of the present invention is deemed to be caused by the large anion radius of the carbon dot.

Although the invention has been described with reference to specific exemplary embodiments, it is apparent for a person skilled in the art that various changes can be made and equivalents can be used as a replacement without departing from the scope of the invention. The invention should consequently not be restricted to the disclosed exemplary embodiments, but rather should enclose all the exemplary embodiments which fall into the scope of the enclosed claims. In particular, the invention also claims protection for the subject matter and the features of the subordinate claims independently of the claims referred to.

What is claimed is:

1. An electrochemical device comprising: a first electrode, a second electrode spaced apart from the first electrode, and an electrolyte filled between the first electrode and the second electrode, wherein the electrochemical device is configured such that a reversible electrochemical redox reaction occurs in at least one of the first electrode and the second electrode, and wherein the electrolyte comprises a salt form consisting of: (i) a metal cation and (ii) a carbon quantum dot anion having an average diameter in the range of 2 to 12 nanometers (nm) and a surface potential of −20 mV or less, wherein the carbon quantum dot anion is in a form of graphite oxide having a carboxyl functional group or a hydroxyl functional group.

2. The electrochemical device according to claim 1, wherein the metal cation is an alkali metal, alkaline earth metal or transition metal.

3. An electrochemical device comprising: a first electrode, a second electrode spaced apart from the first electrode, and an electrolyte filled between the first electrode and the second electrode, wherein: the electrochemical device is configured such that a reversible electrochemical redox reaction occurs in at least one of the first electrode and the second electrode; the electrolyte comprises a salt form consisting of: (i) a metal cation and (ii) a carbon quantum dot anion having an average diameter in the range of 2 to 12 nanometers (nm) and a surface potential of −20 mV or less, wherein the carbon quantum dot anion is in a form of graphite oxide having a carboxyl functional group or a hydroxyl functional group; and the metal cation is at least one selected from the group consisting of Li, Na, K, Mg, and Zn.

4. The electrochemical device according to claim 1, wherein the electrochemical device is one selected from the group consisting of a secondary battery, a solar cell, an electrochromic device, and an electroluminescent device.

5. An electrochemical device comprising: a first electrode, a second electrode spaced apart from the first electrode, and an electrolyte filled between the first electrode and the second electrode, wherein: the electrochemical device is configured such that a reversible electrochemical redox reaction occurs in at least one of the first electrode and the second electrode; the electrolyte comprises a salt form consisting of: (i) metal cation and (ii) a carbon quantum dot anion having an average diameter in the range of 2 to 12 nanometers (nm) and a surface potential of −20 mV or less, wherein the carbon quantum dot anion is in a form of graphite oxide having a carboxyl functional group or a hydroxyl functional group; the electrochemical device is a secondary battery; and the secondary battery is a lithium ion battery or a lithium polymer battery.

\* \* \* \* \*